(12) United States Patent
Gao et al.

(10) Patent No.: US 9,240,753 B2
(45) Date of Patent: Jan. 19, 2016

(54) OSCILLATOR AND POWER MANAGEMENT APPARATUS

(71) Applicant: FUJITSU LIMITED, Kawasaki-shi, Kanagawa (JP)

(72) Inventors: Hong Gao, Inagi (JP); Masafumi Kondou, Kawasaki (JP); Hiroyuki Nakamoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/572,504

(22) Filed: Dec. 16, 2014

(65) Prior Publication Data

US 2015/0180411 A1   Jun. 25, 2015

(30) Foreign Application Priority Data

Dec. 24, 2013   (JP) ................................ 2013-265270
Jun. 20, 2014   (JP) ................................ 2014-127500

(51) Int. Cl.
*H03B 5/12*   (2006.01)

(52) U.S. Cl.
CPC ............ *H03B 5/1234* (2013.01); *H03B 5/1203* (2013.01); *H03B 5/1206* (2013.01); *H03B 5/1228* (2013.01); *H03B 5/1296* (2013.01)

(58) Field of Classification Search
CPC .. H03B 5/1296; H03B 5/1203; H03B 5/1234; H03B 5/1228; H03B 2200/0062; H02M 3/155; H02M 3/1582
USPC ......... 331/117 R, 117 FE, 167, 109, 182, 183
See application file for complete search history.

(56) References Cited

U.S. PATENT DOCUMENTS

| | | | |
|---|---|---|---|
| 6,249,191 B1 * | 6/2001 | Forbes ................. | H03B 5/1228 331/117 D |
| 6,340,787 B1 | 1/2002 | Simeray et al. | |
| 7,411,468 B2 * | 8/2008 | Luong ................. | H03B 5/1228 331/117 R |
| 7,952,444 B2 * | 5/2011 | Xiong ................. | H03B 5/1228 331/108 C |
| 8,330,549 B1 * | 12/2012 | Chen .................... | H03B 5/1231 331/117 R |
| 2013/0070487 A1 | 3/2013 | Ozawa et al. | |

FOREIGN PATENT DOCUMENTS

| | | |
|---|---|---|
| JP | 57-199469 A | 12/1982 |
| JP | 61-236369 A | 10/1986 |
| JP | 62-22349 B2 | 5/1987 |
| JP | 03-47067 B2 | 7/1991 |
| JP | 2002-518989 A | 6/2002 |
| JP | 2005-304231 A | 10/2005 |
| JP | 2011-152015 A | 8/2011 |
| JP | 2013-078111 A | 4/2013 |

* cited by examiner

*Primary Examiner* — Ryan Johnson
(74) *Attorney, Agent, or Firm* — Arent Fox LLP

(57) ABSTRACT

An oscillator includes a transformer, a first capacitor, a first transistor, a depletion or native second transistor, and a current control circuit. The transformer includes a primary winding configured to receive an input voltage and a secondary winding configured to boost the input voltage to generate an output voltage. The first capacitor is configured to form an LC resonant circuit together with the secondary winding to cause oscillation operation, the first transistor is connected in series with the primary winding, and the output voltage is applied to a control terminal of the first transistor. The depletion or native second transistor is connected in series with the primary winding and the first transistor, and the current control circuit is configured to adjust a control voltage applied to a control terminal of the second transistor to control a current flowing through the first winding.

20 Claims, 31 Drawing Sheets

LEVEL SHIFTER

OSCILLATOR AND POWER MANAGEMENT APPARATUS

CROSS-REFERENCE TO RELATED APPLICATION

This application is based upon and claims the benefit of priority of the prior Japanese Patent Application No. 2013-265270, filed on Dec. 24, 2013, and the prior Japanese Patent Application No. 2014-127500, filed on Jun. 20, 2014, the entire contents of which are incorporated herein by reference.

FIELD

The embodiments discussed herein are related to an oscillator and a power management apparatus.

BACKGROUND

Recently, energy harvesting that derives power from energy in the environment (e.g. luminous energy, energy of ambient electromagnetic waves, mechanical vibrational energy and thermal energy) has become a hot research topic.

In order to utilize electric power derived from the energy harvesting as the power supply, for example, a DC-DC converter could be used to boost the voltage (for example, an ultra-low voltage of from several tens to several hundreds of mV) obtained from an ultra-low voltage generation unit (such as a photovoltaic electricity generator, an electromagnetic wave electricity generator, a vibration electricity generator, or a thermoelectric generator).

As described above, for utilization of electric power obtained from energy harvesting, the DC-DC converter (boost converter) could be used to boost an ultra-low voltage generated by the ultra-low voltage generation unit, and a voltage to drive the control circuit of boost converter is also obtained by the ultra-low voltage generation unit.

Specifically, a driving voltage for control circuit of the boost converter could be supplied by an auxiliary step-up unit that can boost the ultra-low voltage generated from the ultra-low voltage generation unit. The step-up unit further includes an oscillator and rectifiers.

In order to operate from ultra-low voltage, to ensure safety and to achieve high efficiencies, it is required that an oscillator in the auxiliary step-up unit be capable of oscillating from ultra-low voltage, regulating its output voltage amplitude and maintaining high efficiencies. However, the existing oscillators could not completely satisfy these requirements.

Conventionally, there have been various types of DC-DC converters applicable to energy harvesting.

Patent Document 1: Japanese Examined Patent Application Publication No. S62-022349
Patent Document 2: Japanese Examined Patent Application Publication No. H03-047067
Patent Document 3: Japanese Laid-open Utility Model Publication No. 2013-078111
Patent Document 4: Japanese National Publication of International Patent Application No. 2002-518989
Patent Document 5: Japanese Laid-open Patent Publication No. 2011-152015
Patent Document 6: Japanese Laid-open Patent Publication No. 2005-304231

SUMMARY

According to an aspect of the embodiments, there is an oscillator including a transformer, a first capacitor, a first transistor, a depletion or native second transistor, and a current control circuit. The transformer includes a primary winding configured to receive an input voltage and a secondary winding configured to boost the input voltage to generate an output voltage.

The first capacitor is configured to form an LC resonant circuit together with the secondary winding to cause oscillation operation, the first transistor is connected in series with the primary winding, and the output voltage is applied to a control terminal of the first transistor.

A depletion or native second transistor is connected in series with the primary winding and the first transistor, and the current control circuit is configured to adjust a control voltage applied to a control terminal of the second transistor to control a current flowing through the first winding.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
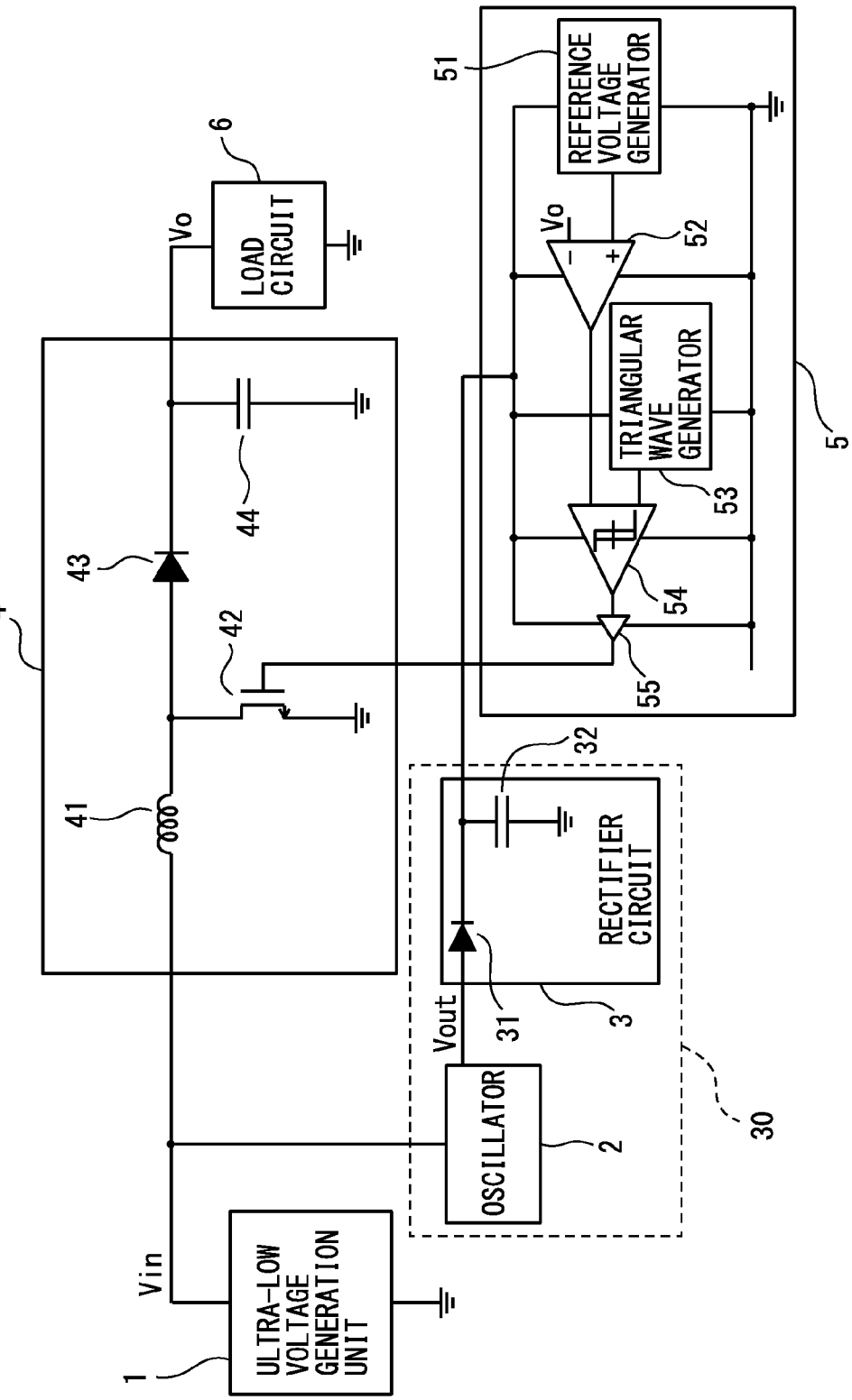
FIG. 1 is a block diagram depicting an example of a power management apparatus.

First, exemplary oscillators and an exemplary power management apparatus and problems thereof will be described with reference to FIG. 1 to FIG. 3, before detailed description of proposed oscillators and power management apparatuses FIG. 1 is a block diagram depicting an exemplary power management apparatus. In FIG. 1, reference sign 1 denotes an ultra-low voltage generation unit, reference sign 2 denotes an oscillator, reference sign 3 denotes a rectifier circuit, reference sign 4 is a boost converter for power transmission, reference sign 5 denotes a control circuit (driver), and reference sign 6 denotes a load circuit.

The oscillator 2 and the rectifier circuit 3, for example, composes an auxiliary step-up unit (DC-DC converter) 30 to provide voltage large enough to drive the control circuit 5 and, thus, to generate the control signal for a switching transistor 42 of the boost converter 4 described below.

The ultra-low voltage generation unit 1 is, for example, a photovoltaic electricity generator, an electromagnetic wave electricity generator, a vibration electricity generator, a thermoelectric generator, or the like that generates an ultra-low input voltage Vin (for example, a voltage of from several tens to several hundreds of mV) from an energy source such as, luminous energy, energy of ambient electromagnetic waves, mechanical vibrational energy and thermal energy.

The input voltage (ultra-low voltage) Vin from the ultra-low voltage generation unit 1 is input to the oscillator 2 of an auxiliary step-up unit 30 and also input to a main DC-DC converter (boost converter) 4 for power transmission.

The oscillator 2 boosts the input voltage Vin from the ultra-low voltage generation unit 1 and outputs an AC voltage to the rectifier circuit 3. The boosted AC voltage (for example, around 2 V) is converted to a steady DC voltage by the rectifier circuit 3 is output to the control circuit 5. The rectifier circuit 3 includes a diode 31 and a capacitor 32.

The boost converter 4 includes an inductor 41, a switching transistor 42, a diode 43, and a capacitor 44. The boost converter 4 boosts the input voltage Vin from the ultra-low voltage generation unit 1 to generate an output voltage Vo and then outputs the output voltage Vo to a load circuit 6.

The control circuit 5 (PWM signal generator) includes a reference voltage generator 51, a differential amplifier 52, a triangular wave generator 53, a hysteresis comparator 54, and a gate driver 55, and controls switching operation of the switching transistor 42 so as to regulate the output voltage Vo. In FIG. 1, obviously, structures of the boost converter 4 and the control circuit 5 are merely exemplary, and can be any of various structures.

Figure 2A:
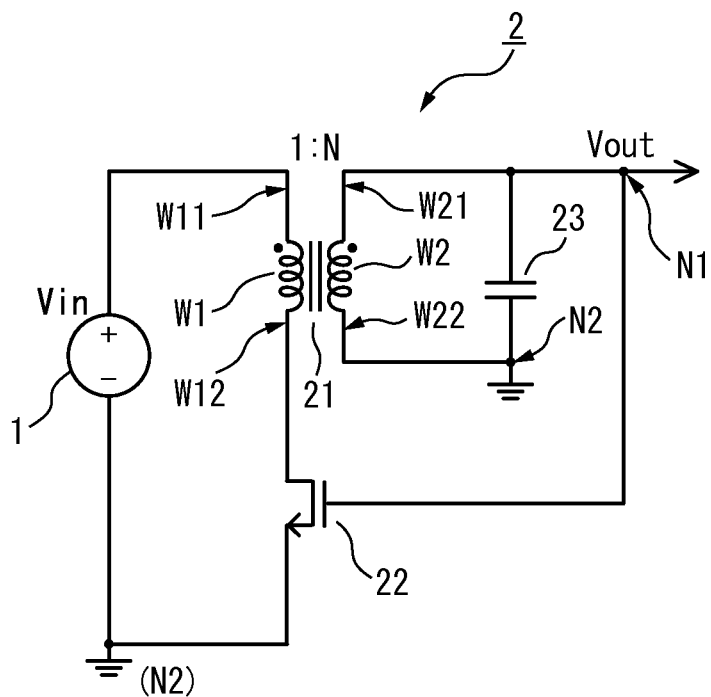
FIG. 2A and FIG. 2B are diagrams for illustrating an exemplary oscillator.
Figure 2B:
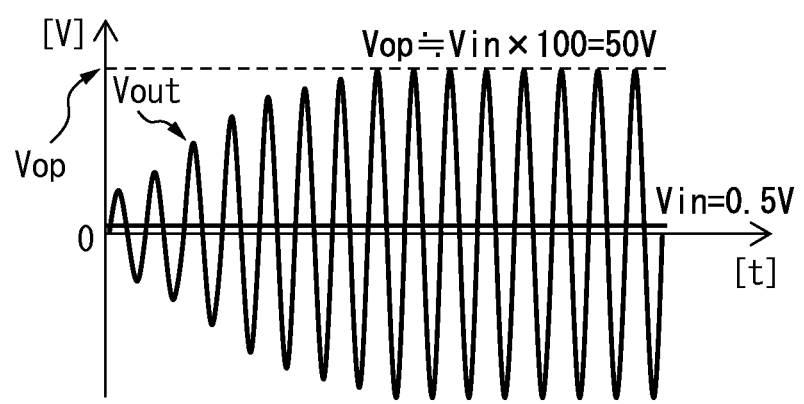

FIG. 2A and FIG. 2B are diagrams for illustrating an exemplary oscillator. FIG. 2A depicts a circuit diagram of the oscillator, and FIG. 2B depicts a waveform diagram for illustrating a peak value (peak voltage) Vop of the output voltage Vout of the oscillator. In FIG. 2B, the lateral axis represents time (t) and the vertical axis represents voltage (V).

As depicted in FIG. 2A, the oscillator 2 in the auxiliary step-up unit 30 of the power management apparatus depicted in FIG. 1 includes a transformer 21, a depletion or native nMOS transistor 22, and a capacitor 23. In FIG. 2A, black dotted marks put near a first terminal W11 of a primary winding W1 of the transformer 21 and a first terminal W21 of a secondary winding W2 thereof represent dotted ends of the windings.

For example, even at a gate voltage of 0 V, a depletion nMOS transistor is turned ON (normally ON) and current flows therethrough, and when the gate voltage becomes equal to or less than a predetermined negative voltage (a threshold voltage), the transistor is turned OFF.

Meanwhile, a native nMOS transistor having a negative threshold voltage can prevent, for example, loss of electrons occurring due to voltage drop by a positive threshold voltage, and thus is excellent in electric charge transmission efficiency.

In contrast to the depletion nMOS transistor, an enhancement nMOS transistor is turned OFF (normally OFF) and no current flows therethrough at a gate voltage of 0 V, and when the gate voltage becomes equal to or more than a predetermined positive voltage (threshold voltage), the transistor is turned ON and current flows therethrough.

The first terminal W11 of the primary winding W1 of the transformer 21 is connected to one end (for example, a positive potential output terminal) of the ultra-low voltage generation unit 1, and a second terminal W12 of the primary winding W1 thereof is connected to a drain of the transistor 22. A source of the transistor 22 is connected to the other end (for example, a negative potential output terminal) of the ultra-low voltage generation unit 1 and also connected to a ground node N2.

The first terminal W21 of the secondary winding W2 of the transformer 21 is connected to one end of the capacitor 23 and a gate of the transistor 22, and a second terminal W22 of the secondary winding W2 is connected to the other end of the capacitor 23 and also grounded (N2).

The first terminal W21 of the secondary winding W2 of the transformer 21 is also connected to a voltage output node N1. An output voltage Vout from the voltage output node N1 is input to, for example, the rectifier circuit 3 of the auxiliary step-up unit 30 described above to be rectified thereby.

A turns ratio of the primary winding W1 and the secondary winding W2 in the transformer 21 is set to be 1:N (for example, 1:100) to amplify an output amplitude (a maximum value (peak voltage) Vop of the output voltage Vout). The capacitor 23 forms an LC resonant circuit together with the secondary winding W2 to cause oscillation.

The transistor 22 is a normally-ON depletion or native nMOS transistor, and thus has a threshold voltage of from around 0 V to a negative value, so that the transistor 22 is operational even when the input voltage Vin is an extremely low voltage of, for example, around several tens of mV.

When the turns ratio of the primary winding W1 and the secondary winding W2 in the transformer 21 is set to be 1:100 as described above, a peak voltage Vop of the output voltage Vout for an input voltage Vin of, for example, 20 mV is around 2 V, and thus the control circuit 5 can be expected to operate appropriately. However, for example, when the input voltage Vin is 500 mV, a peak voltage Vop of the output voltage Vout is around 50 V, thus, the control circuit 5 may be broken.

In other words, in the oscillator depicted in FIG. 2A, for example, when the input voltage Vin from the ultra-low voltage generation unit 1 is sufficiently boosted to obtain an output voltage Vout, a high level of input voltage Vin causes an excessively large output amplitude.

Figure 3A:
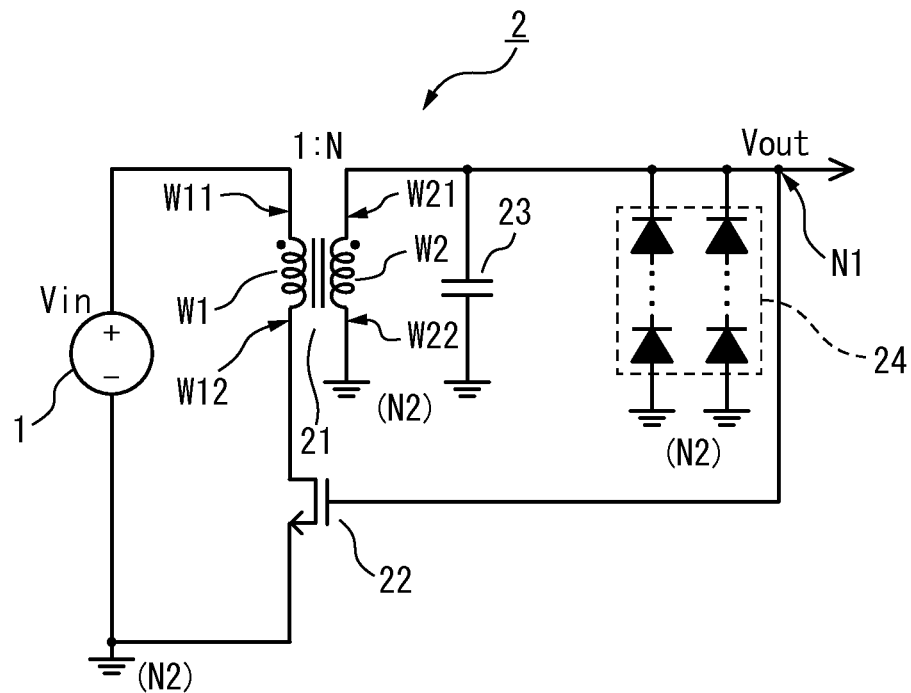
FIG. 3A and FIG. 3B are diagrams for illustrating another exemplary oscillator.
Figure 3B:
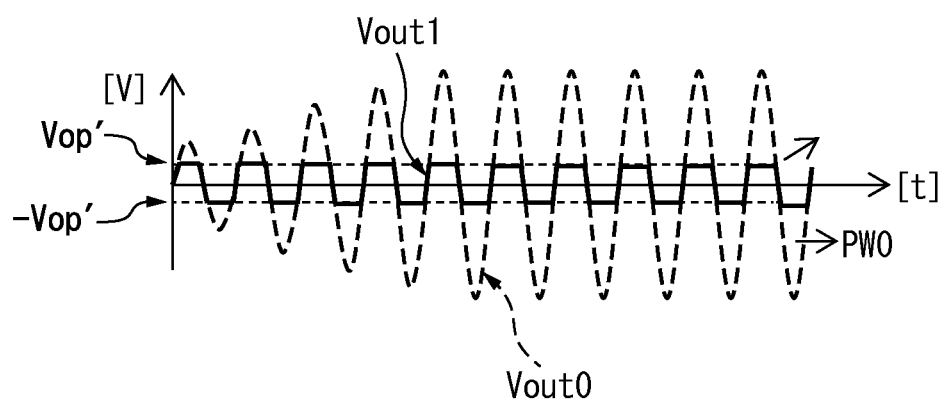

FIG. 3A and FIG. 3B are diagrams for illustrating another exemplary oscillator. FIG. 3A depicts a circuit diagram of the oscillator and FIG. 3B depicts a waveform graph for illustrating peak voltages Vop' (−Vop') of the output voltage Vout. With reference to FIG. 3A and FIG. 2A, the oscillator 2 depicted in FIG. 3A includes a diode unit 2 as an element added to the oscillator 2 depicted in FIG. 2A described above.

The diode unit 24 includes a plurality of cascade-connected diodes arranged in a forward direction and a reverse direction between the first terminal W21 (voltage output node N1) of the secondary winding W2 of the transformer 21 and the ground (ground node N2) to clip the output voltage Vout to predetermined peak voltages Vop' and −Vop'.

In other words, in the oscillator without diode unit 24, an output voltage Vout has a large output amplitude at a large input voltage as indicated by a broken line in FIG. 3B. On the other hand, in the oscillator provided with the diode unit 24, an output voltage Vout has a waveform with its amplitude limited by the peak voltages Vop' and −Vop', as indicated by a solid line Vout1 in FIG. 3B. Accordingly, for example, when the input voltage Vin changes to high level, a maximum value of the output voltage Vout is limited to a predetermined value, which can therefore eliminate the risk of breakage of the control circuit 5.

However, the oscillator 2 depicted in FIG. 3A has large power consumption due to, for example, voltage clipping function by the diode unit 24. As the power consumption by the diode unit 24 increases with the input voltage Vin, power efficiency is extremely low at a high input voltage.

Hereinafter, a detailed description of oscillators and power management apparatuses will be given according to embodiments with reference to the attached drawings. The oscillators according to the embodiments can be used, for example, in the auxiliary step-up unit 30 for boosting an ultra-low voltage Vin from the ultra-low voltage generation unit 1 in FIG. 1 to generate a voltage for driving the control circuit 5 and the switching transistor 42. But the use of the oscillators is not limited thereto.

Figure 4A:
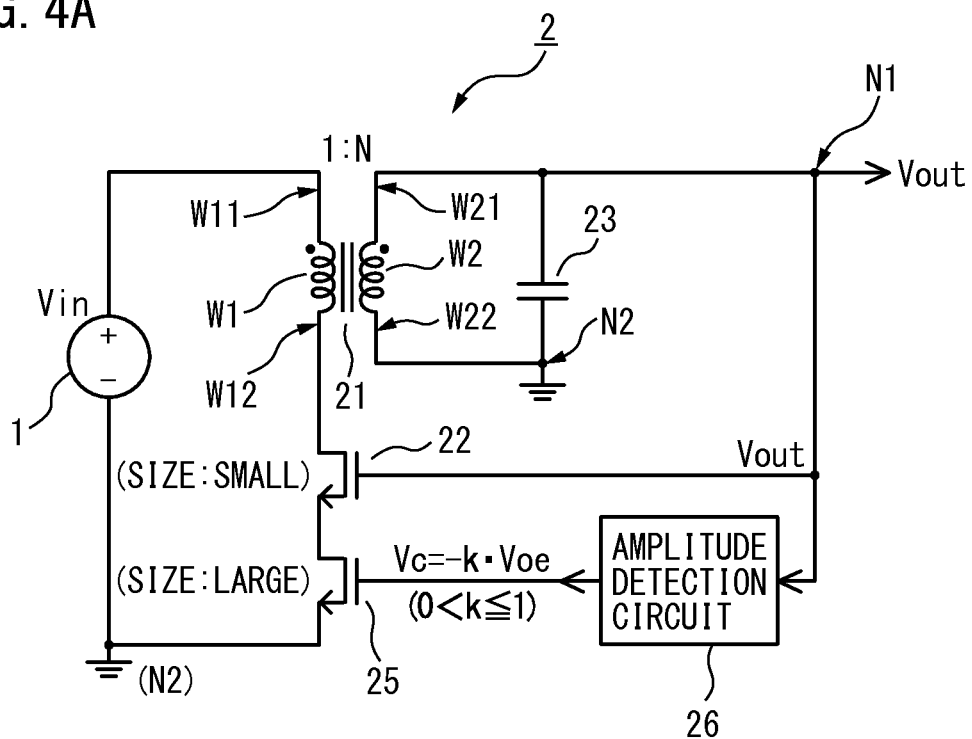
FIG. 4A, FIG. 4B, and FIG. 4C are diagrams for illustrating an oscillator according to a first embodiment.
Figure 4B:
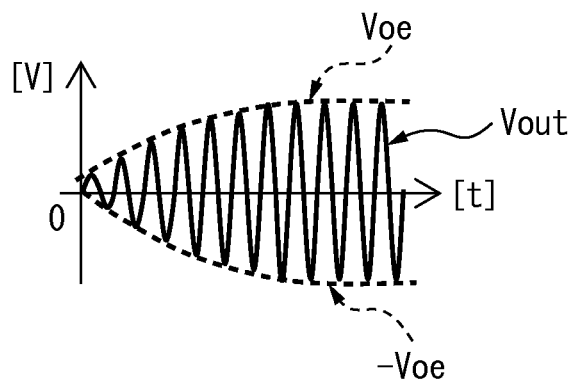
Figure 4C:
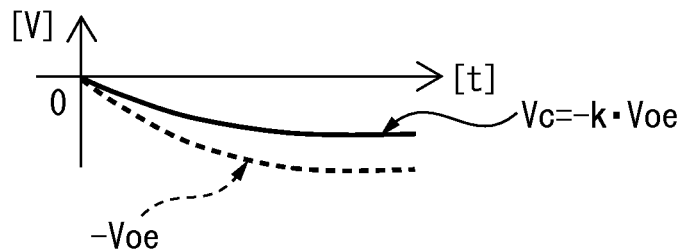

FIG. 4A, FIG. 4B, and FIG. 4C are diagrams for illustrating an oscillator according to a first embodiment. FIG. 4A is a block diagram for illustrating the oscillator of the first embodiment, and FIG. 4B is a graph depicting a waveform of an output voltage Vout and peak values thereof (envelope voltages) Voe and −Voe.

In addition, FIG. 4C is a graph depicting the negative envelope voltage −Voe of the output voltage Vout and an output (control voltage) Vc of the amplitude detection circuit (envelop detection circuit: current control circuit). In FIG. 4B and FIG. 4C, the lateral axis represents time (t) and the vertical axis represents voltage (V).

As depicted in FIG. 4A, the oscillator 2 of the first embodiment includes a transformer 21, nMOS transistors (for example, depletion or native nMOS transistors) 22 and 25 having a threshold voltage of from around 0 V to a negative value, and a capacitor (a first capacitor) 23.

Furthermore, the oscillator 2 of the first embodiment includes an amplitude detection circuit (envelop circuit: current control circuit) 26. In FIG. 4A, black dotted marks put near a first terminal W11 of a primary winding W1 of a transformer 21 and a first terminal W21 of a secondary winding W2 thereof represent dotted ends of the windings.

The oscillator 2 of the first embodiment is applied to, for example, the oscillator 2 of the auxiliary step-up unit 30 of the power management apparatus depicted in FIG. 1, and an output voltage Vout from a voltage output node (first node) N1 of the oscillator 2 is, for example, rectified by a rectifier circuit 3. The rectified voltage is then used to drive a control circuit 5.

Although this is the same in the other embodiments as in the first embodiment, the application of the oscillator 2 of each of the embodiments is not limited to the auxiliary step-up unit 30 for utilizing electric power from energy harvesting as a power supply for a load circuit.

The first terminal W11 of the primary winding W1 of the transformer 21 is connected to one end (for example, a positive potential output terminal) of the ultra-low voltage generation unit 1, and the second terminal W12 of the primary winding W1 is connected to a drain of the transistor 22.

A source of the transistor 22 is connected to a drain of the transistor 25, and a source of the transistor 25 is connected to the other end (for example, a negative potential output terminal) of the ultra-low voltage generation unit 1 and also connected to a ground node (second node) N2.

A first terminal W21 of the secondary winding W2 of the transformer 21 is connected to one end of the capacitor 23 and a gate of the transistor 22, and a second terminal W22 of the second winding W2 is connected to the other end of the capacitor 23 and also grounded to the node (N2).

The first terminal W21 of the secondary winding W2 of the transformer 21 is also connected to a voltage output node N1. An output voltage Vout from the voltage output node N1 is input, for example, to the rectifier circuit 3 of the auxiliary step-up unit 30 described above to be rectified thereby.

A turns ratio of the primary winding W1 and the secondary winding W2 in the transformer 21 is set to be 1:N (for example, 1:100) to amplify the output voltage Vout. The capacitor 23 forms an LC resonant circuit together with the secondary winding W2 to cause oscillation.

Transistors 22 and 25 are normally-ON depletion or native nMOS transistors. Thus, the threshold voltage of the transistor 22 is from around 0 V to a negative value, whereby the transistor 22 is operational, for example, even when the input voltage Vin is an extremely low voltage of around several tens of mV. In addition, an output (control voltage Vc) of the amplitude detection circuit 26 is applied to a gate of the transistor 25.

FIG. 4B depicts changes of amplitude voltages (envelope voltages) Voe and −Voe of an output voltage Vout detected by the amplitude detection 26, for example, in accordance with changes of an output voltage at the output node N1 (a gate voltage of the transistor 22).

Then, as depicted in FIG. 4C, the amplitude detection circuit 26 generates a signal (control voltage Vc) by multiplying the negative envelope voltage −Voe by a predetermined coefficient k (0<k≤1) and applies the signal to the gate of the transistor 25.

When the depletion or native nMOS transistor 25 is controlled by a negative control voltage Vc thereto, the negative envelope voltage −Voe of the output voltage Vout is multiplied by a coefficient k and, therefore, the control voltage Vc is given as Vc=−k*Voe.

In other words, when the envelope voltage −Voe of the output voltage Vout becomes low (the oscillation amplitude becomes larger), the control voltage (=−k*Voe) also becomes low (reduced to a negative potential) thus, a current flowing through the transistor 25 (22) becomes small.

Accordingly, since a current flowing through the primary winding W1 of the transformer 21 is reduced, a current flowing through the secondary winding W2 of the transformer 21 is also reduced. As a result, the amplitude of the output voltage Vout (output amplitude) is limited.

Thus, in the oscillator of the first embodiment, applying a control voltage Vc from the amplitude detection circuit 26 to the gate of the transistor 25 allows a current flowing through the primary winding W1 of the transformer 21 to be controlled by the transistor 25, thereby allowing the output voltage Vout to be limited. This can reduce, for example, power consumption by the diode unit 24 described with reference to FIG. 3.

Figure 5A:
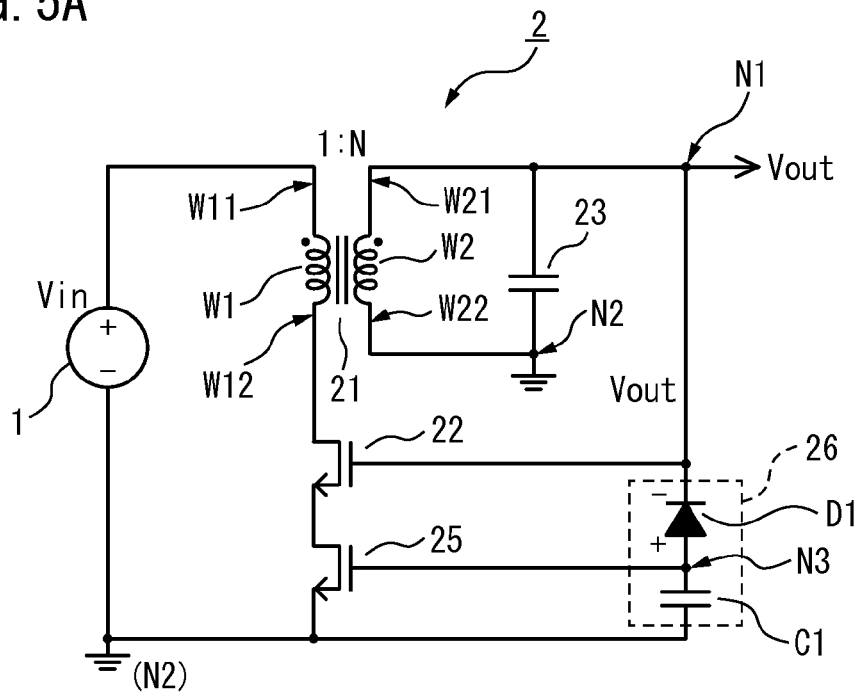
FIG. 5A, FIG. 5B, and FIG. 5C are diagrams for illustrating an oscillator according to a second embodiment.
Figure 5B:
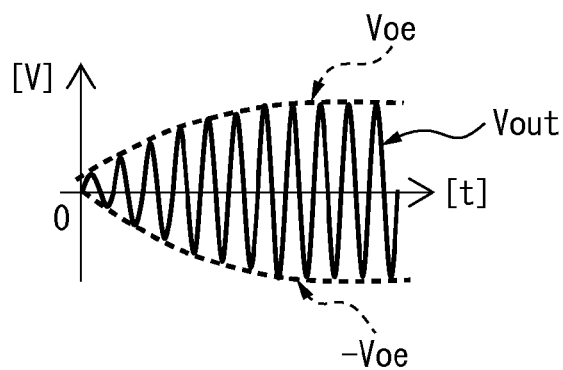
Figure 5C:
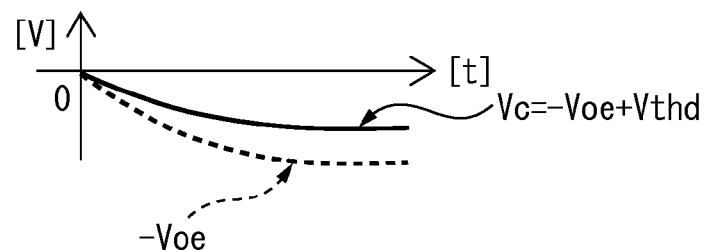

FIG. 5A, FIG. 5B, and FIG. 5C are diagrams for illustrating an oscillator according to a second embodiment, in which the amplitude detection circuit 6 of the first embodiment in FIG. 4A is formed by a diode D1 and a capacitor C1 connected in series. FIG. 5A is a circuit diagram depicting the oscillator of the second embodiment, and FIG. 5B and FIG. 5C are graphs corresponding to FIG. 4B and FIG. 4C described above.

Compared with FIG. 4A described above, the amplitude detection unit 26 in the oscillator 2 of the second embodiment illustrated in FIG. 5A includes the diode D1 and the capacitor (second capacitor) C1. A cathode of the diode D1 is connected to a voltage output node N1 (a first terminal W21 of a secondary winding W2 of a transformer 21) and one end of a capacitor 23, and an anode thereof is connected to one end of a capacitor C1.

The other end of the capacitor C1 is connected to a ground node N2, and the gate of the transistor 25 is connected to an intermediate connection node (third node) N3 connecting the anode of the diode D1 and the one end of the capacitor C1. When a threshold voltage (barrier potential) of the diode D1 is Vthd, a control voltage Vc from the amplitude detection circuit 26 is given as Vc=−Voe+Vthd.

In this manner, in the oscillator of the second embodiment, applying the control voltage Vc from the amplitude detection circuit 26 to the gate of the transistor 25 allows a current flowing through the primary winding W1 of the transformer 21 to be controlled by the transistor 25, thereby allowing the output voltage Vout to be limited.

As a result, low power consumption as well as oscillation from an ultra-low voltage and amplitude limitation for output voltage can be achieved. This advantageous effect is obtained not only by the oscillators of the first and the second embodiments but also by respective embodiments described below.

In the oscillator of the second embodiment described above, regarding the transistors 22 and 25 connected in series with a primary winding W1 side, when the current flowing through the primary winding W1 does not need to be limited, an ON resistance of the transistor 25 is preferably set to be as small as possible.

For example, in boosting of an ultra-low input voltage Vin from the ultra-low voltage generation unit 1, as in energy harvesting, it is preferable to boost the voltage sufficiently by the transformer 21 when the input voltage Vin is at a normally considerable ultra-low voltage level, namely, when output amplitude control is not required.

Accordingly, designing a transistor 25 with a larger gate width(size) than that of the transistor 22 brings about a reduction in power consumption caused by the ON-resistance of the transistor 25.

Figure 6:
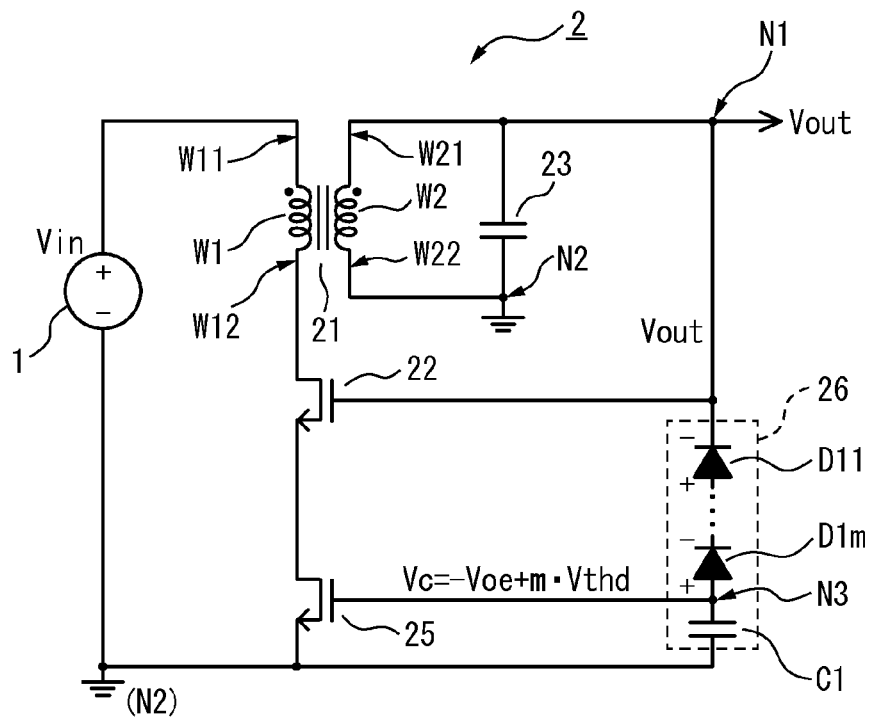
FIG. 6 is a diagram for illustrating an oscillator according to a third embodiment.

FIG. 6 is a diagram depicting an oscillator according to a third embodiment. Compared with FIG. 5A described above, the single diode D1 in the amplitude detection circuit 26 of the second embodiment is formed by m pieces of diodes D11 to D1m cascade-connected in the oscillator 2 of the third embodiment as illustrated in FIG. 6.

Accordingly, a control voltage Vc from the amplitude detection circuit 26 is given as Vc=−Voe+m*Vthd, and the control voltage Vc is applied to the gate of the transistor 25. The number of the diodes is set to be m. When the threshold voltage of the transistor 25 is Vtht, the peak value of the output voltage Vout can be expressed as: Voe<m*Vthd−Vtht. Increasing the number (m) of the diodes leads to an increase in the peak value of Vout.

Accordingly, in the oscillator of the third embodiment, the peak value of an output voltage Vout can adjusted by the number of the cascade-connected diodes D11 to D1m between the voltage output node N1 and the intermediate connection node N3.

Figure 7:
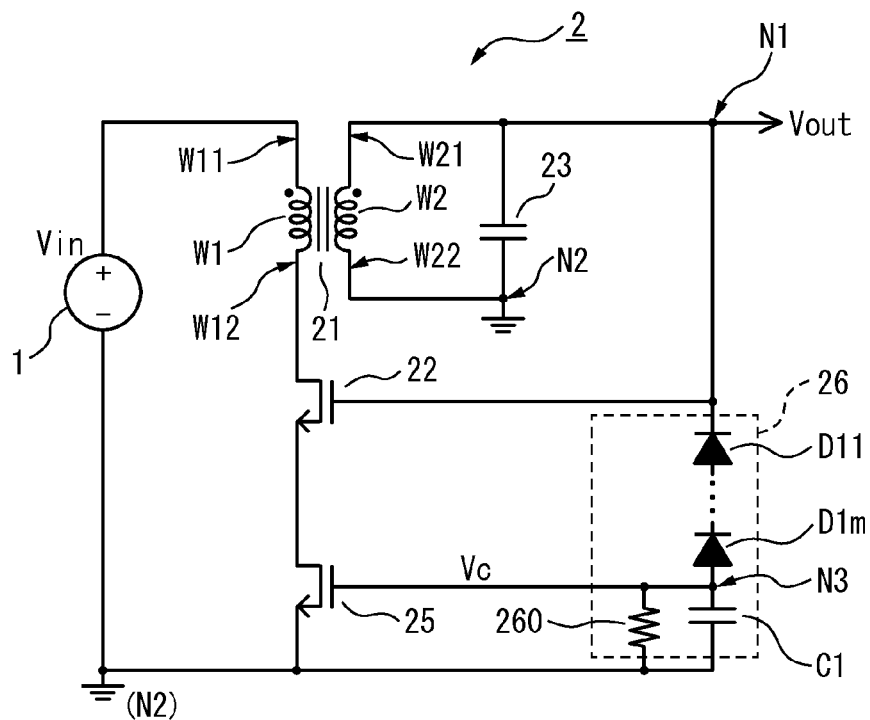
FIG. 7 is a diagram for illustrating an oscillator according to a fourth embodiment.

FIG. 7 is a diagram for illustrating an oscillator according to a fourth embodiment. Compared with FIG. 6 described above, an oscillator 2 of the fourth embodiment in FIG. 7 includes a resistor 260 provided in parallel with a capacitor C1, as an element added to the amplitude detection circuit 26 of the third embodiment.

In other words, one end of the resistor 260 is connected to the intermediate connection node N3 and the other end thereof is connected to the ground node N2, so that the resistor 260 is connected in parallel with the capacitor C1.

The capacitor C1 is allowed to be discharged by the resistor 260, whereby the gate voltage (control voltage Vc) of the transistor 25 is set to be a ground level (0 V), for example, in an initial state.

The resistance value of the resistor 260 is determined by a balance between a lower resistance value for discharging electric charge stored in the capacitor C1 in a shorter period of time, and a higher resistance value for suppressing unnecessary power consumption. Specifically, the resistance value of the resistor 260 can be set to be, for example, around several MΩ.

Figure 8A:
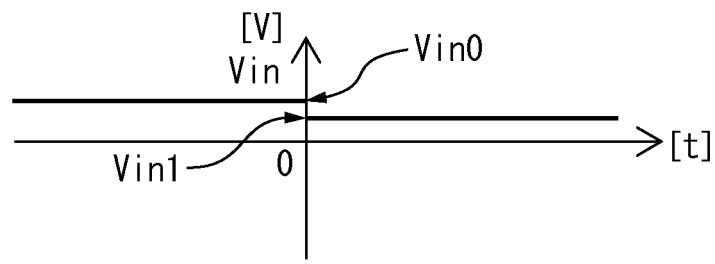
FIG. 8A, FIG. 8B, and FIG. 8C are graphs (1) for illustrating an operation of the oscillator of the fourth embodiment depicted in FIG. 7.
Figure 8B:
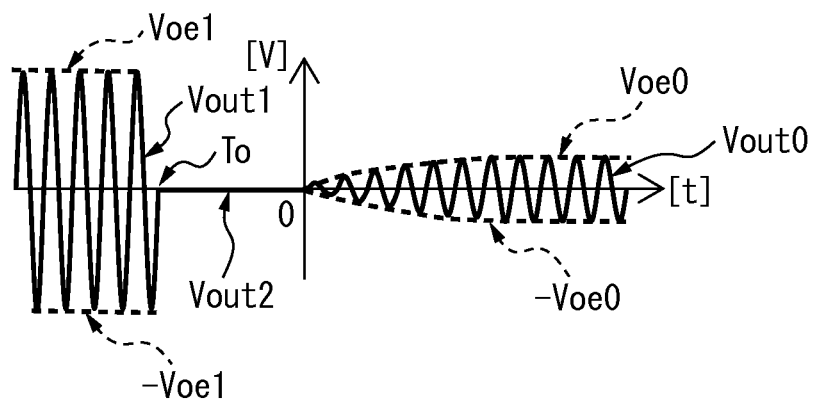
Figure 8C:
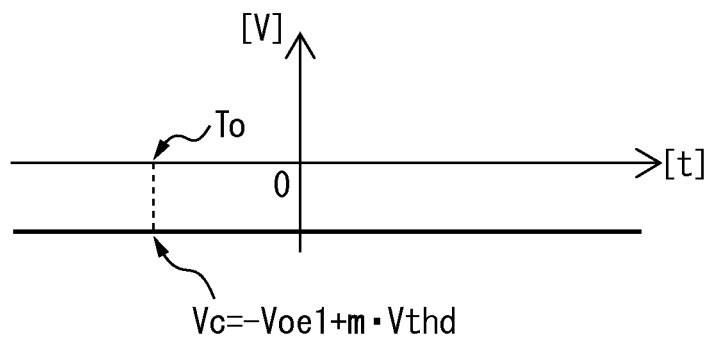
Figure 9A:
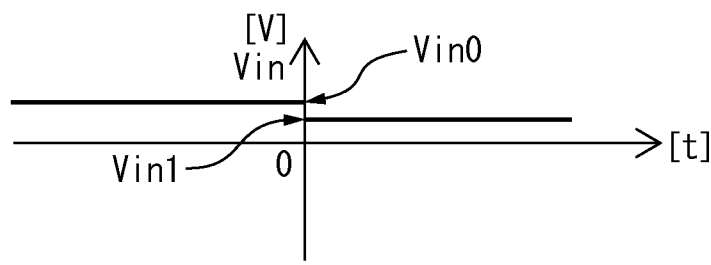
FIG. 9A, FIG. 9B, and FIG. 9C are graphs (2) for illustrating an operation of the oscillator of the fourth embodiment depicted in FIG. 7.
Figure 9B:
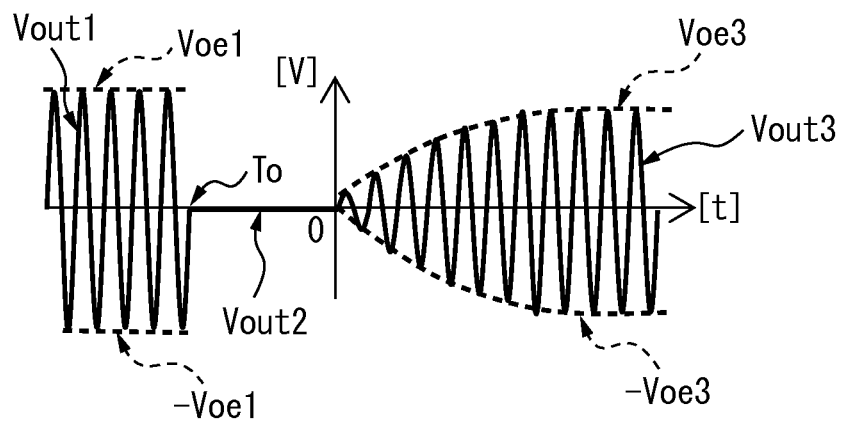
Figure 9C:
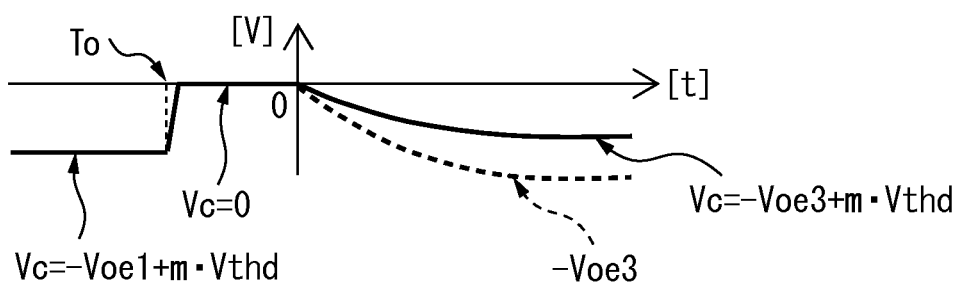

FIG. 8A, FIG. 8B, FIG. 8C, FIG. 9A, FIG. 9B, and FIG. 9C are graphs for illustrating operations of the oscillator of the fourth embodiment depicted in FIG. 7. FIG. 8A to FIG. 8C depict an operation of the oscillator without the resistor 260 (i.e., the third embodiment depicted in FIG. 6), and FIG. 9A to FIG. 9C depict operation of the oscillator with the resistor 260 (i.e., the fourth embodiment depicted in FIG. 7).

FIG. 8A and FIG. 9A are graphs depicting changes over time in an input voltage Vin, and FIG. 8B and FIG. 9B are graphs depicting waveforms of an output voltage Vout and envelope voltages thereof, Voe and −Voe. In addition, FIG. 8C and FIG. 9C are graphs depicting changes over time in a control voltage Vc.

As depicted in FIG. 8A and FIG. 9A, the input voltage (output voltage of the ultra-low voltage generation unit 1) Vin changes from a high voltage level Vin0 to a low voltage level Vin1 before and after a time t=0. In addition, as depicted in FIG. 8B and FIG. 9B, at a time $t=T_0$, oscillation operation of the oscillator 2 is temporarily stopped, and then, at the time t=0, the oscillation operation of the oscillator 2 is started again.

As depicted in FIG. 8C and FIG. 9C, when the oscillator 2 outputs an output voltage Vout1 by a high voltage level Vin0, an electric charge for detecting a negative envelope voltage −Voe1 of the output voltage Vout1 is stored in the capacitor C1 of the amplitude detection circuit 26.

At the time $t=T_0$, the oscillation operation of the oscillator 2 is temporarily stopped. Without the resistor 260, the electric charge of the capacitor C1 is maintained, as depicted in FIG. 8C, and the control voltage Vc remains the same (Vc=−Voe1+m*Vthd).

As a result, for example, a state continues in which, the input voltage Vin is at the high voltage level Vin0 and the transistor 25 limits a current flowing through the primary winding W1. Accordingly, for example, even when, at the time t=0, the oscillation operation of the oscillator 2 is restarted by the input voltage Vin of the low voltage level Vin1, the function of the transistor 25 limiting the current flowing through the primary winding W1 is also maintained since the control voltage Vc still satisfies the following equation: Vc=−Voe1+m*Vthd.

As a result, as depicted in FIG. 8B, when the oscillation with the input voltage Vin1 is started from the time t=0, the output voltage Vout has a voltage waveform (Vout0) with a limited output amplitude, so that it can be difficult to obtain a sufficient output voltage level.

In contrast, as depicted in FIG. 9C, the fourth embodiment includes the resistor 260 in parallel with the capacitor C1. Thus, when the oscillation operation of the oscillator 2 is stopped at the time $t=T_0$, the electric charge stored in the capacitor C1 is discharged through the resistor 260 and the control voltage Vc goes to a ground level (0 V).

In other words, since the control voltage Vc (=−Voe1+m*Vthd) up to the time $t=T_0$ is reset to the initial state (Vc=0), there is no problem when, at the time t=0, the oscillation operation of the oscillator 2 is restarted with the input voltage Vin of the low voltage level Vin1.

Accordingly, at the start of the oscillation of the oscillator 2 with the input voltage Vin1 at the time t=0, the function of the transistor 25 for limiting the current flowing through the primary winding W1 does not work. Thus, an output voltage Vout3 in accordance with the input voltage Vin1 is generated, as depicted in FIG. 9B. The control in accordance with the change of the output voltage Vout is the same as that in each of the embodiments described above, and a control voltage Vc applied to the gate of the transistor 25 is given as Vc=−Voe3+m*Vthd.

Figure 10:
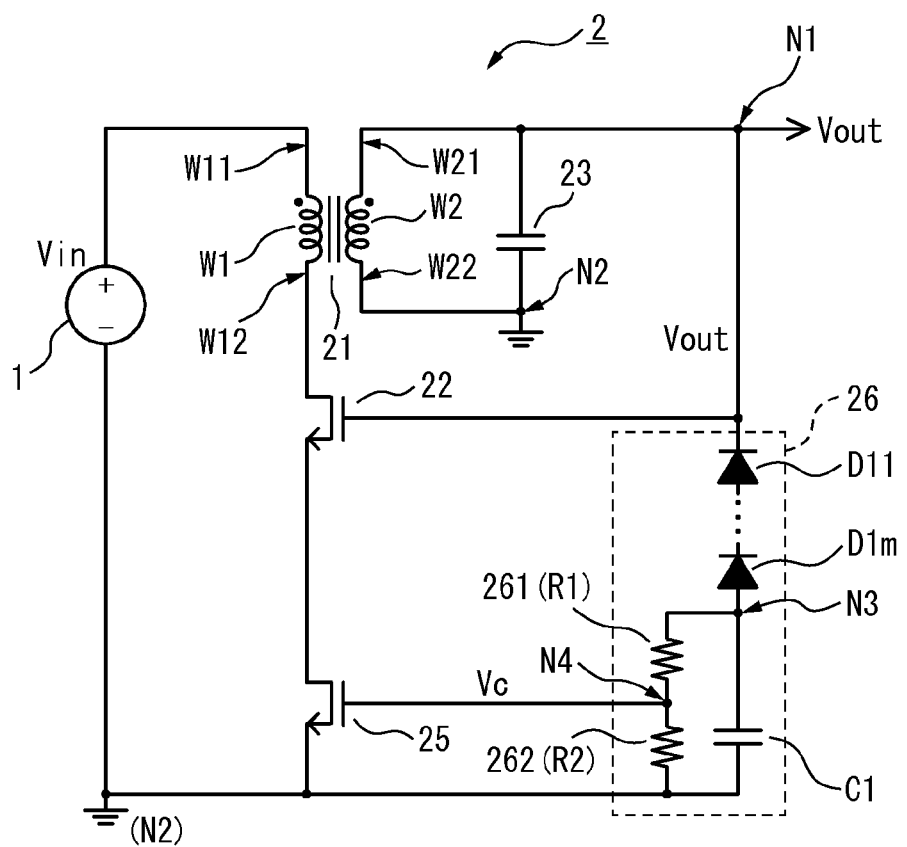
FIG. 10 is a diagram for illustrating an oscillator according to a fifth embodiment.

FIG. 10 is a diagram for illustrating an oscillator according to a fifth embodiment. Compared with FIG. 7 described above, the oscillator 2 of the fifth embodiment, indicated in FIG. 10, includes two resistors 261 and 262 in the amplitude detection circuit 26, whereby a control voltage Vc is adapted to be extracted from a resistance division node (fourth node) N4 therebetween.

In other words, the resistors 261 and 262 connected in series are arranged between the intermediate connection node N3 and the ground node N2 such that the resistors 261 and 262 are connected in parallel with the capacitor C1.

In the oscillator 2 of the fifth embodiment, generating a gate voltage (control voltage Vc) of the transistor 25 by resistance division using the resistors 261 and 262 allows adjustment of an output amplitude (envelope voltages Voe and −Voe).

Figure 11A:
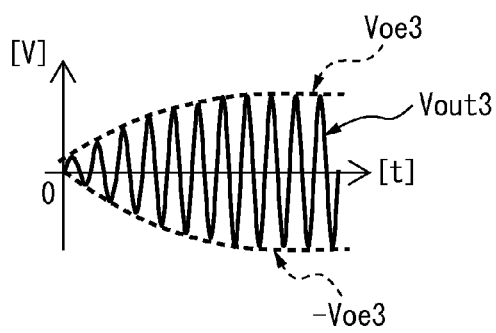
FIG. 11A, FIG. 11B, FIG. 11C, and FIG. 11D are graphs for illustrating operations of the oscillator of the fifth embodiment depicted in FIG. 10.
Figure 11B:
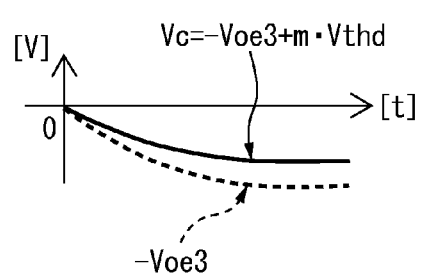
Figure 11C:
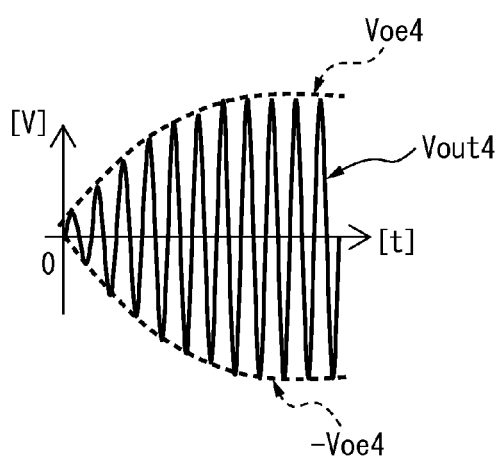
Figure 11D:
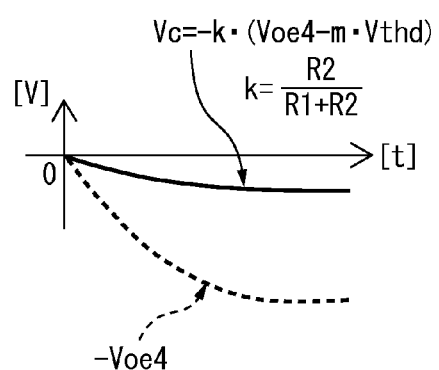

FIG. 11A, FIG. 11B, FIG. 11C and FIG. 11D are graphs for illustrating operations of the oscillator of the fifth embodiment. FIG. 11A and FIG. 11B depict an operation of the oscillator without the resistance voltage division (i.e., the fourth embodiment depicted in FIG. 7), and FIG. 11C and FIG. 11D depict an operation of the oscillator with the resistance voltage division (i.e., the fifth embodiment depicted in FIG. 10). FIG. 11A and FIG. 11B correspond to FIG. 9B and FIG. 9C described above.

As depicted in FIG. 11C and FIG. 11D, when a resistance value of the resistor 261 is R1 and a resistance value of the resistor 262 is R2, a control voltage Vc applied to the gate of the transistor 22 is given as Vc=−k*(Voe4−m*Vthd). The coefficient k represents a resistance voltage division ratio of the resistors 261 and 262, namely, k=R2/(R1+R2). FIG. 11C and FIG. 11D indicate a situation where k is ¼ (when R1:R2=3:1).

As illustrated in FIG. 11A, FIG. 11B, FIG. 11C and FIG. 11D, it is obvious that generating the control voltage Vc by resistance division using the resistors 261 and 262 allows adjustment of the negative envelope voltage −Voe.

From the equation of the control voltage Vc, as the value of k becomes smaller, the negative envelope voltage −Voe has a lower potential (the output amplitude becomes larger). This regulates the output voltage Vout to a desired value.

Figure 12:
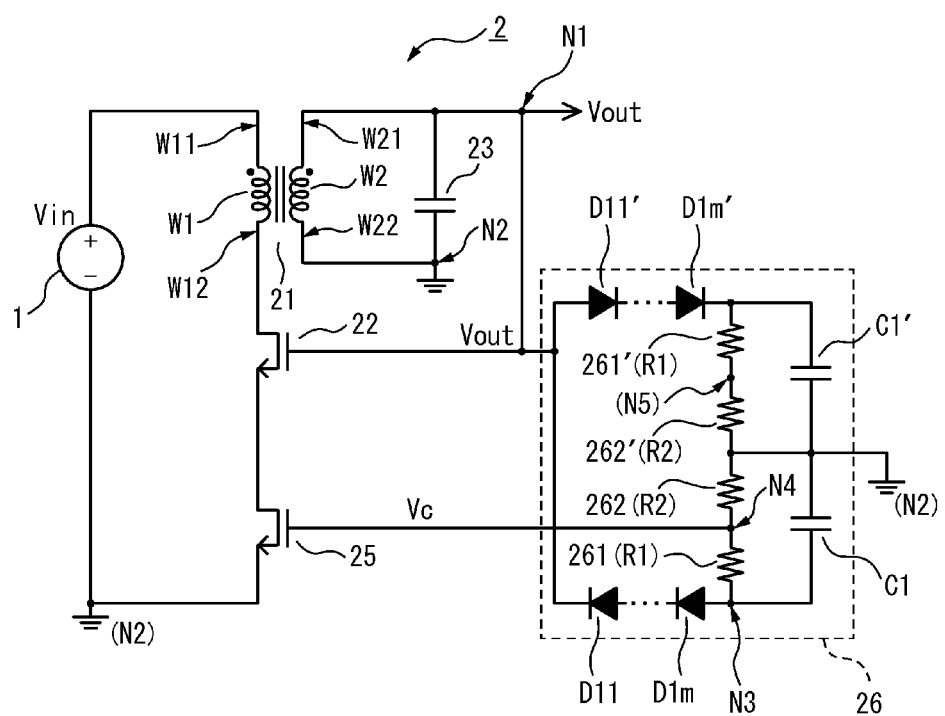
FIG. 12 is a diagram for illustrating an oscillator according to a sixth embodiment.
Figure 13A:
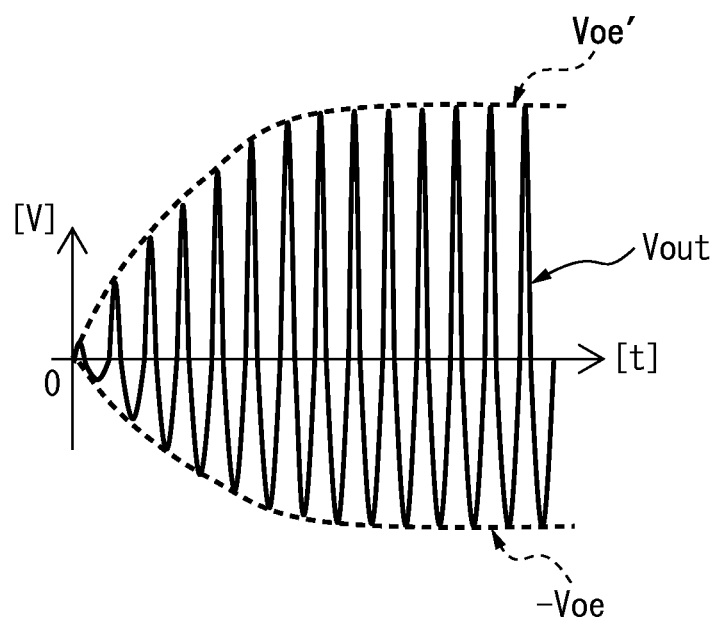
FIG. 13A and FIG. 13B are graphs for illustrating operations of the oscillator of the sixth embodiment depicted in FIG. 12.
Figure 13B:
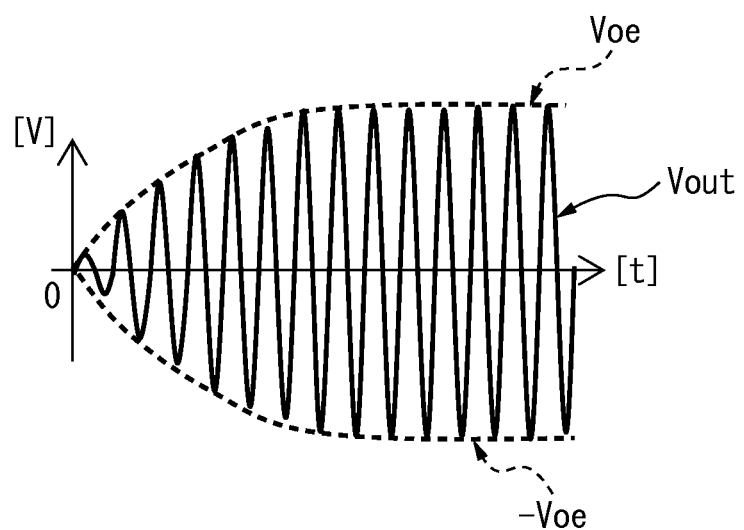

FIG. 12 is a diagram for illustrating an oscillator according to a sixth embodiment, and FIG. 13A and FIG. 13B are graphs for illustrating operations of the oscillator of the sixth embodiment. Compared with FIG. 10 described above, the amplitude detection circuit 26 of the fifth embodiment in FIG. 12 has a symmetrical circuit structure in the oscillator 2 of the sixth embodiment.

FIG. 13A depicts an operation of the oscillator in which the amplitude detection circuit 26 is asymmetrical (i.e., the fifth embodiment depicted in FIG. 10), and FIG. 13B depicts an operation of the oscillator in which the amplitude detection circuit 26 has the symmetrical structure (i.e., the sixth embodiment depicted in FIG. 12).

As depicted in FIG. 12, the amplitude detection circuit 26 includes a capacitor C1 for detecting a negative envelope voltage −Voe (−Voe4) to generate a control voltage Vc, m pieces of diodes D11 to D1m, and resistors 261 and 262, similarly to the amplitude detection circuit 26 of the fifth embodiment.

Furthermore, the amplitude detection circuit 26 includes, as dummies, a capacitor C1' for a positive envelope voltage Voe, m pieces of diodes D11' to D1m', and resistors 261' and 262', symmetrical to the circuit for generating the control voltage Vc from the negative envelope voltage −Voe.

This structure can correct the asymmetry of an amplitude of a positive-side output voltage Vout (positive envelope voltage Voe') to an amplitude of a negative-side output voltage Vout (negative envelope voltage −Voe') due to the asymmetry of the amplitude detection circuit 26 as depicted in FIG. 13A, so as to obtain a waveform as depicted in FIG. 13B.

In other words, since the amplitude detection circuit 26 of the sixth embodiment has a symmetrical circuit structure, the positive-side and negative-side amplitudes of the output voltage Vout (positive and negative envelope voltages Voe and −Voe) are symmetrical as depicted in FIG. 13B, thus, deformation of the oscillation waveform can be reduced.

It is obvious that the sixth embodiment which includes the amplitude detection circuit with the symmetrical circuit structure can be applied not only to the amplitude detection circuit of the fifth embodiment of FIG. 10 but also to amplitude detection circuits having various circuit structures.

Figure 14A:
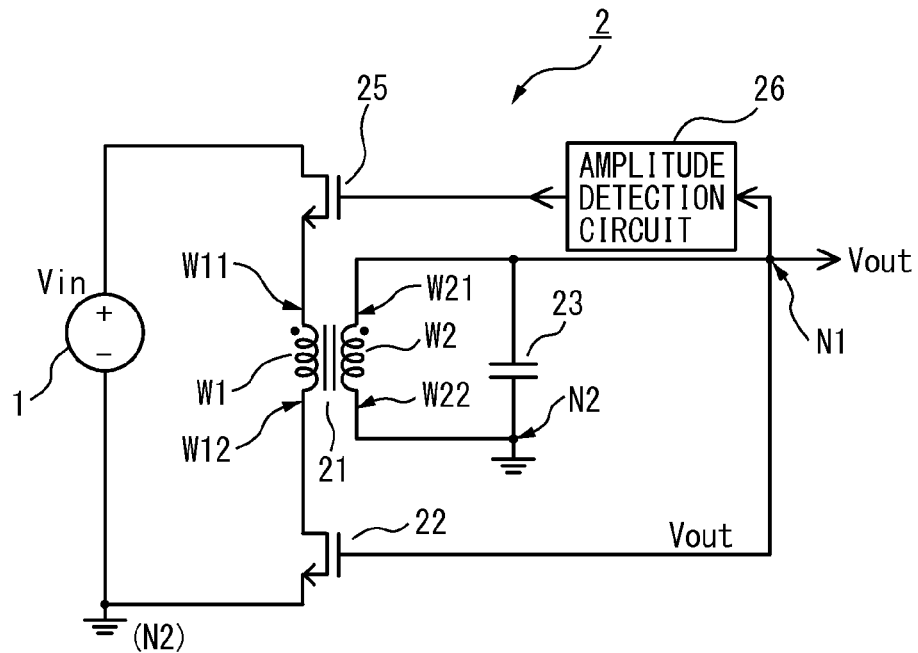
FIG. 14A and FIG. 14B are diagrams for illustrating an oscillator according to a seventh embodiment.
Figure 14B:
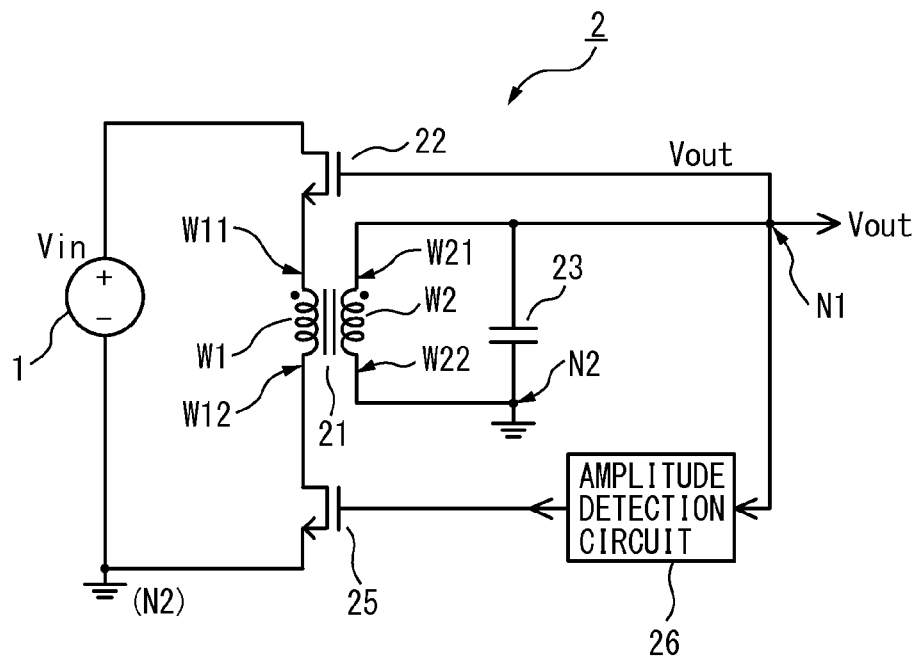

FIG. 14A and FIG. 14B are diagrams for illustrating oscillators according to a seventh embodiment. Compared with FIG. 4A described above, the transformer 21 is arranged between the transistor 22 and the transistor 25 in the oscillators of the seventh embodiment as illustrated in FIG. 14A and FIG. 14B.

FIG. 14A and FIG. 14B depict a mutual replacement between the transistor 25 whose gate receives a control voltage Vc from the amplitude detection circuit 26 and the transistor 22 whose gate receives an output voltage Vout. For example, the amplitude detection circuit of any one of the second through the sixth embodiments described with reference to FIG. 5A to FIG. 13B can be applied, as it is, to the amplitude detection circuit 26 of the seventh embodiment.

Figure 15A:
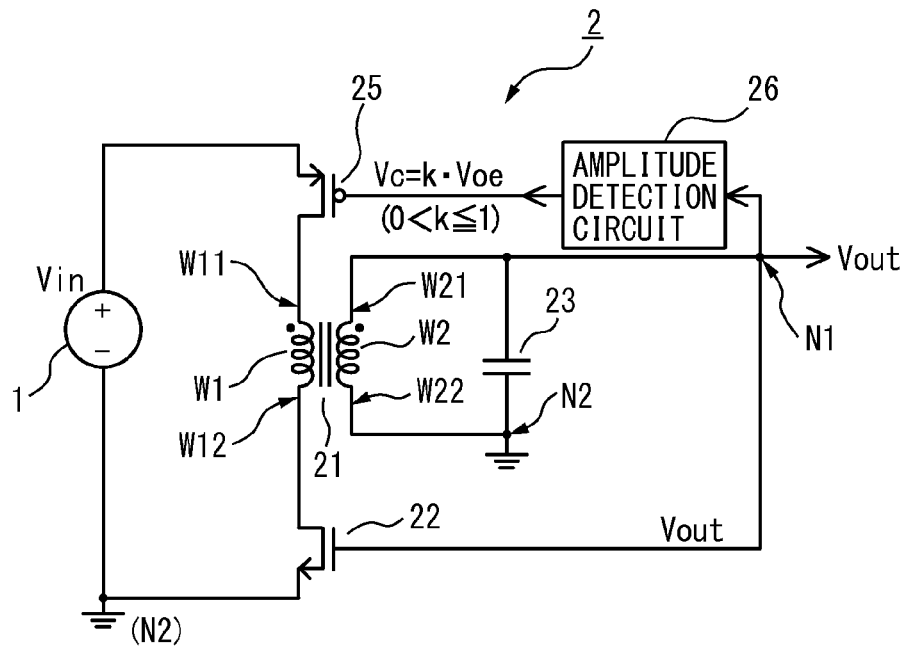
FIG. 15A, FIG. 15B, and FIG. 15C are diagrams for illustrating an oscillator according to an eighth embodiment.
Figure 15B:
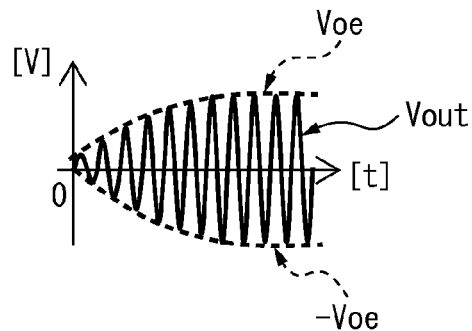
Figure 15C:
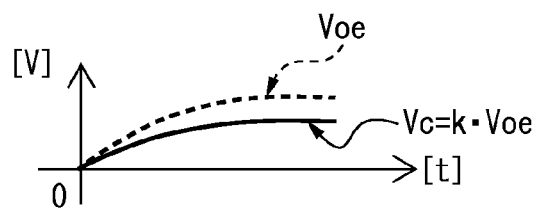

FIG. 15A, FIG. 15B, and FIG. 15C are diagrams for illustrating an oscillator according to an eighth embodiment, which corresponds to an oscillator in which the nMOS transistor 25 in the oscillator of FIG. 14A described above has been changed to a normally-ON depletion or native pMOS transistor. FIG. 15A to FIG. 15C are diagrams corresponding to, for example, FIG. 4A to FIG. 4C described above.

The depletion or native pMOS transistor has a threshold voltage of from around 0 V to a positive voltage and can be operated, for example, even when the input voltage Vin is an extremely low voltage of around several tens of mV. In addition, due to the change of the transistor 25 to the depletion or native pMOS transistor 25, the amplitude detection circuit 26 detects a positive-side amplitude of an output voltage Vout, namely, a positive envelope voltage Voe to generate a control voltage Vc that is to be applied to the gate of the transistor 25.

As the amplitude detection circuit 26 generating the control voltage Vc applied to the pMOS transistor 25, for example, in the amplitude detection circuit 26 of the sixth embodiment depicted in FIG. 12 described above, a control voltage Vc is extracted from a connection point (N5) of the resistors 261' and 262'.

As depicted in FIG. 15B and FIG. 15C, in the oscillator of the eighth embodiment, the control voltage Vc (output voltage of the amplitude detection circuit 26) given to the gate of the depletion or native pMOS transistor 25 is given as Vc=k*Voe, in which the coefficient k is represented by 0<k≤1.

In other words, when the envelope voltage Voe (oscillation amplitude) of the output voltage Vout becomes large, the control voltage Vc (=k*Voe) becomes also high (increases to a positive potential). As a result, a current flowing through the transistor 25 (22) becomes small.

Accordingly, since a current flowing through the primary winding W1 of the transformer 21 is reduced, a current flowing through the secondary winding W2 thereof is also reduced. As a result, an amplitude of the output voltage Vout (output amplitude) is also limited.

In this manner, preferably, the pMOS transistor receiving a control voltage Vc from the amplitude detection circuit 26 is arranged on a high potential side (positive side) of the input voltage Vin and the nMOS transistor 22 receiving an output voltage Vout is arranged on a lower potential side (negative side) of the input voltage Vin, since operation is stabilized.

Figure 16:
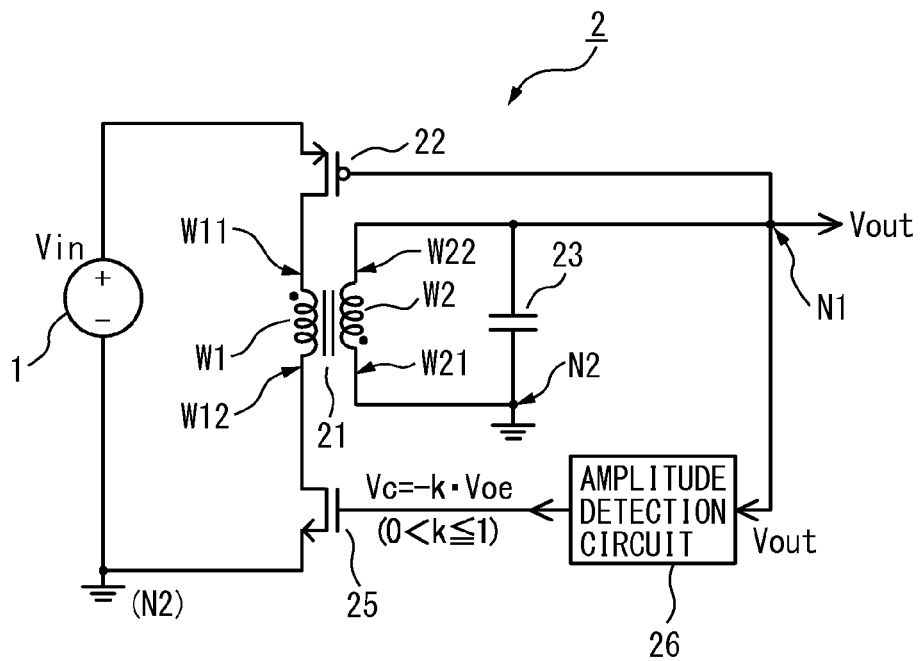
FIG. 16 is a diagram for illustrating an oscillator according to a ninth embodiment.

FIG. 16 is a diagram for illustrating an oscillator according to a ninth embodiment. Compared with FIG. 15A described above, a transformer 21 is similarly arranged between the pMOS transistor and the nMOS transistor in FIG. 16.

In the oscillator of the ninth embodiment, however, an amplitude detection circuit 26 is used to control a depletion or native nMOS transistor 25. In addition, in the transformer 21, wires of primary and secondary windings W1 and W2 are wound so as to have polarities opposite to each other.

A control voltage Vc from the amplitude detection circuit 26 can be given, for example, as Vc=−k*Voe, similarly to the first embodiment described with reference to FIG. 4A to FIG. 4C. In this manner, preferably, the nMOS transistor 25 receiving a control voltage Vc from the amplitude detection circuit 26 is arranged on the negative side of the input voltage Vin and the pMOS transistor 22 receiving an output voltage Vout is arranged on the positive side of the input voltage Vin, since operation is stabilized.

Figure 17:
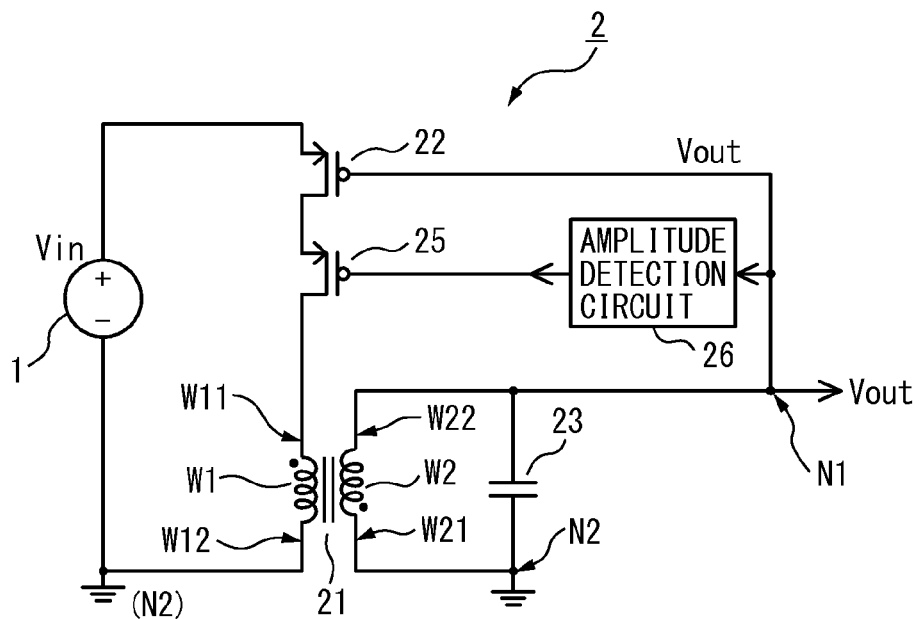
FIG. 17 a diagram for illustrating an oscillator according to a tenth embodiment.

FIG. 17 is a block diagram for illustrating an oscillator according to a tenth embodiment, in which transistors 22 and 25 are normally-ON depletion or native pMOS transistors and directly connected to each other. Additionally, in a transformer 21 of the oscillator, wires of a primary winding W1 and a secondary winding W2 are wound so as to have polarities opposite to each other, and a control voltage Vc from an amplitude detection circuit 26 is applied to a gate of the transistor 25.

The control voltage Vc applied to the gate of the depletion or native pMOS transistor 25 is given as Vc=k*Voe (0<k≤1), similar to the eighth embodiment described with reference to FIG. 15A to FIG. 15C. In addition, as the amplitude detection circuit 26 generates a control voltage Vc applied to the pMOS transistor 25, for example, in the amplitude detection circuit 26 of FIG. 12, the control voltage Vc may be extracted from a connection portion (N5) of the resistors 261' and 262'.

Figure 18A:
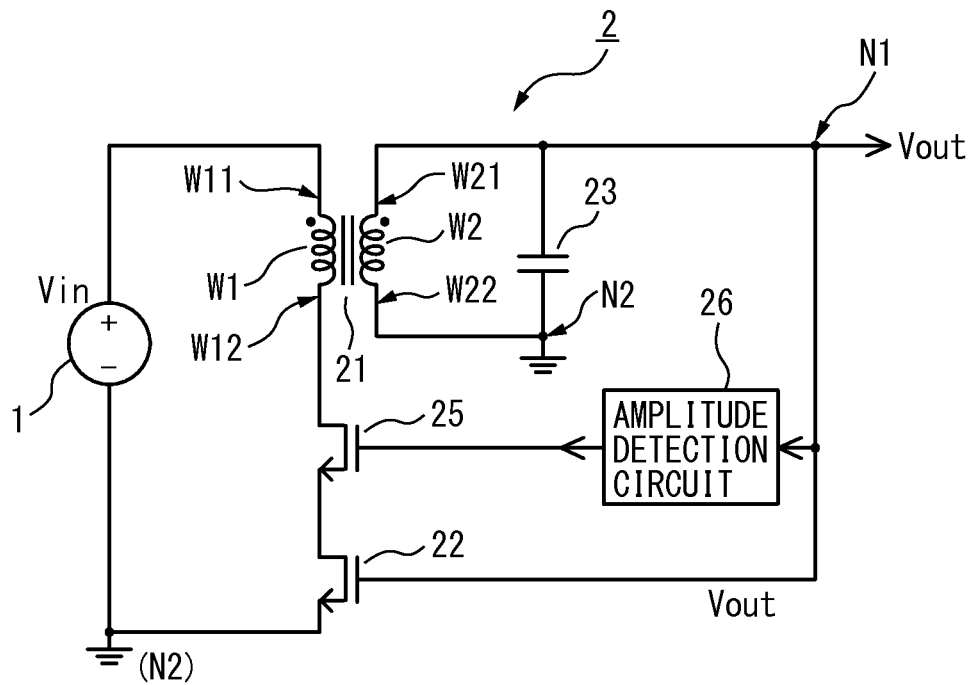
FIG. 18A and FIG. 18B, respectively, are diagrams for illustrating oscillators according to eleventh and twelfth embodiments.
Figure 18B:
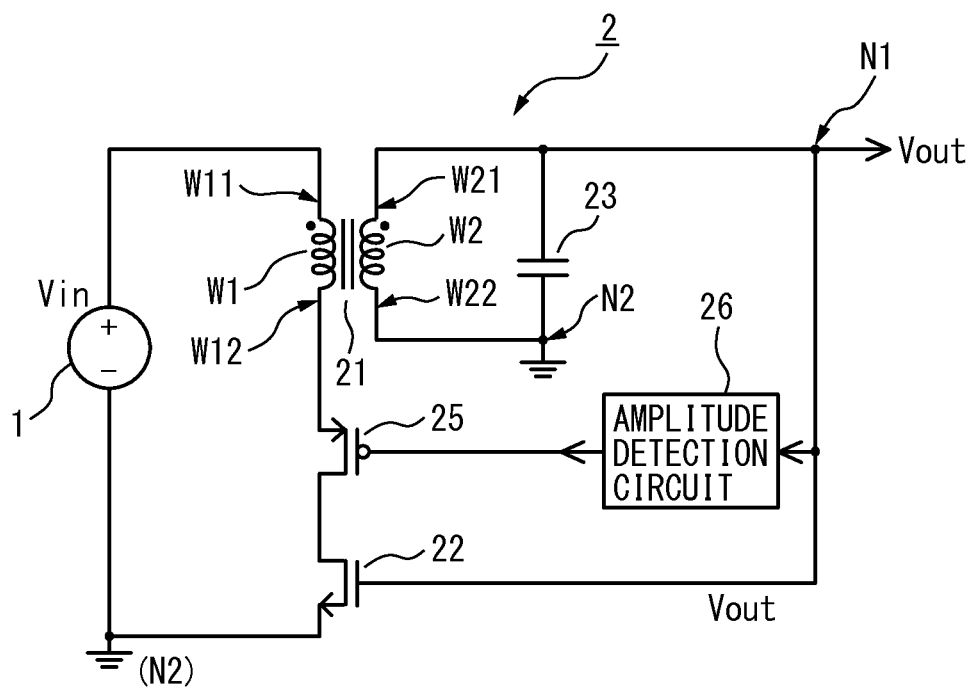

FIG. 18A and FIG. 18B, respectively, are diagrams for illustrating oscillators according to an eleventh embodiment and a twelfth embodiment, in which FIG. 18A depicts the eleventh embodiment and FIG. 18B depicts the twelfth embodiment. Wires of a primary winding W1 and a secondary winding W2 in a transformer 21 of each oscillator are wound so as to have the same polarity.

Compared with FIG. 4A described above, the oscillator of the eleventh embodiment as illustrated in FIG. 18A corresponds to an oscillator in which the positions of the transistors 22 and 25 in the first embodiment are switched. In addition, the oscillator of the twelfth embodiment in FIG. 18B corresponds to an oscillator in which the transistor 25 in the eleventh embodiment in FIG. 18A is changed from the nMOS transistor to a pMOS transistor.

Thus, for example, the positional relationship between the transistors 22 and 25 and the transformer 21, conductivity types of the transistors 22 and 25 can be changed variously. Then, in such respective embodiments or modified examples, for example, the structure of the amplitude detection circuit 26 of each of the second through the sixth embodiments described with reference to FIG. 5A to FIG. 13B can be used, as described above.

Figure 19A:
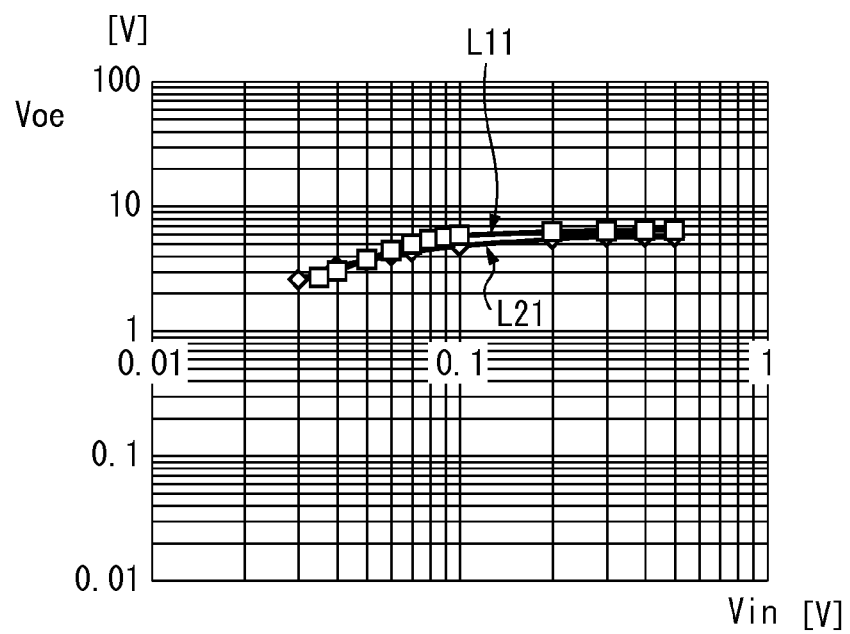
FIG. 19A and FIG. 19B, respectively, are diagrams for illustrating an advantageous effect of the oscillator of one of the embodiments.
Figure 19B:
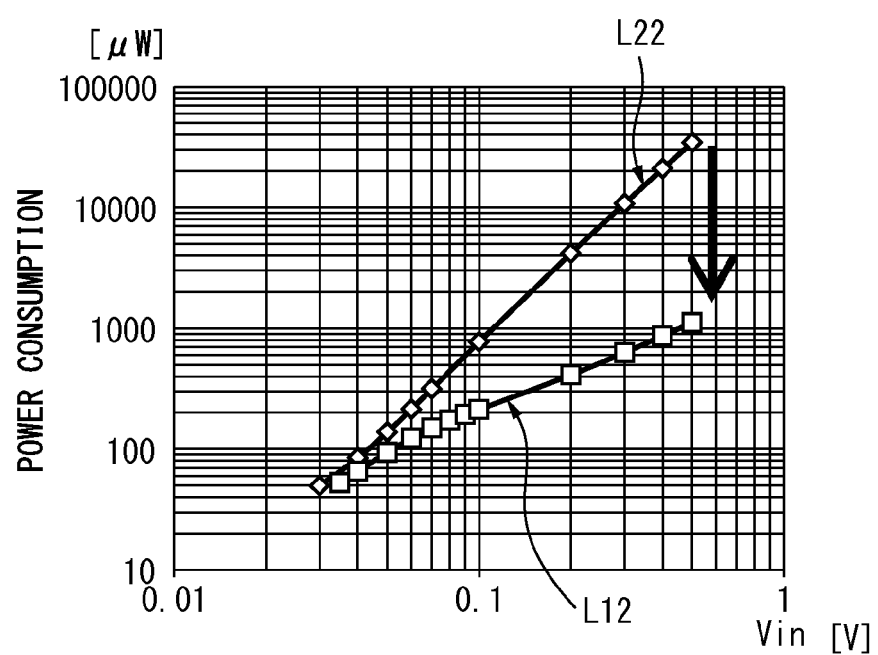

FIG. 19A and FIG. 19B are graphs for illustrating effects of the oscillator according to one of the embodiments, in which characteristics (L11 and L12) of the oscillator of the sixth embodiment described with reference to FIG. 12 are compared with characteristics (L21 and L22) of the oscillator described with reference to FIG. 3.

FIG. 19A depicts a relationship of the peak value of output voltage Voe of the oscillator 2 in accordance with input voltage Vin (output of the ultra-low voltage generation unit 1), and FIG. 19B depicts a relationship of power consumption (electric power supplied from the ultra-low voltage generation unit 1) in accordance with input voltage Vin.

As depicted in FIG. 19A, for example, while the relationship of output voltage Vout in accordance with input voltage Vin from the ultra-low voltage generation unit 1 is substantially equal between the oscillators 2, the oscillator 2 of the sixth embodiment is found to have significantly less power consumption than that of FIG. 3, as depicted in FIG. 19B.

In other words, as depicted in FIG. 19B, the characteristic curve L12 of the oscillator 2 of the sixth embodiment is found to indicate an operation with less power consumption than the characteristic curve L22 of the oscillator of FIG. 3, as the input voltage Vin becomes higher. Obviously, this effect is not limited to the sixth embodiment and exhibited similarly in all of the embodiments.

Figure 20:
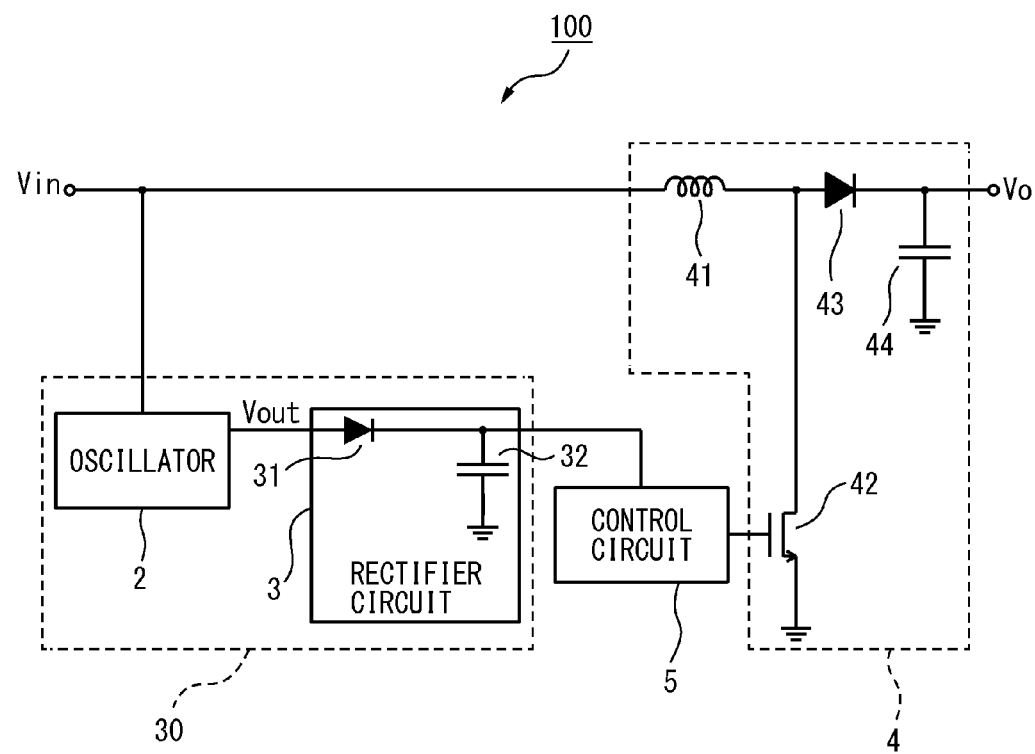
FIG. 20 is a block diagram depicting an example of a semiconductor device incorporating the oscillator according to any one of the embodiments.

FIG. 20 is a block diagram depicting an example of a semiconductor device incorporating the oscillator according to any one of the embodiments. As described above, the oscillator of each of the embodiments can be applied, for example, as the oscillator 2 of the auxiliary step-up unit 30 in the power management apparatus described with reference to FIG. 1.

In other words, as depicted in FIG. 20, the power management apparatus includes the boost converter 4, the auxiliary step-up unit 30 including the oscillator 2 and the rectifier circuit 3, and the control circuit 5 receiving a voltage from the auxiliary step-up unit 30 to control the boost converter 4.

As described with reference to FIG. 1, the boost converter 4 includes the inductor 41, the switching transistor 42, the diode 43, and the capacitor 44 and boosts an input voltage Vin from the ultra-low voltage generation unit 1 to generate an output voltage Vo.

An output voltage Vout of the oscillator 2 is rectified by the rectifier circuit 3 to be the driving voltage for the control circuit 5. The control circuit 5 generates, for example, control signal for the switching transistor 42 in the boost converter 4 to regulate the output voltage Vo. The power management apparatus depicted in FIG. 20 is formed, for example, on a single semiconductor chip 100 and can be provided as a semiconductor device to users.

Figure 21:
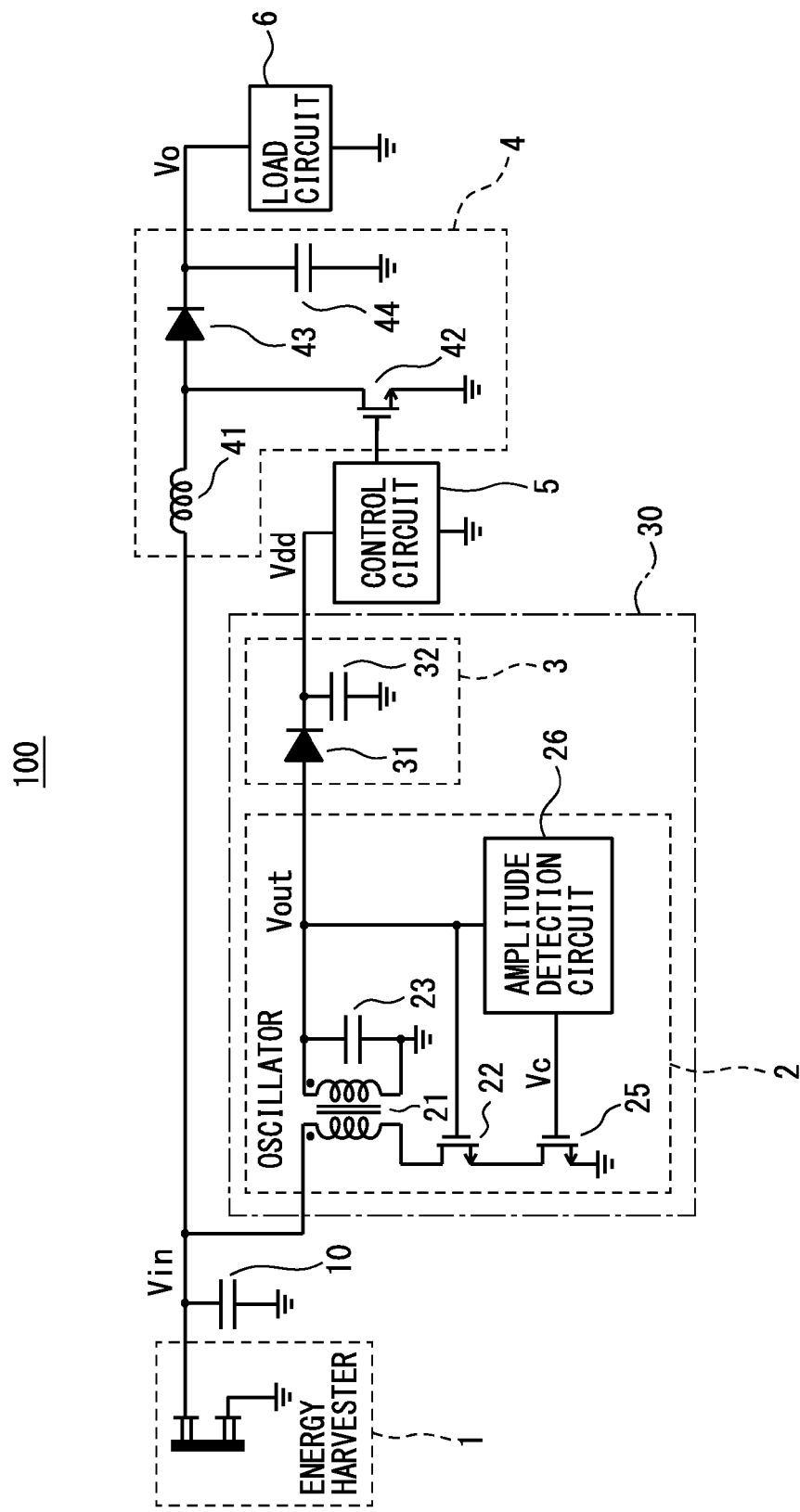
FIG. 21 is a block diagram depicting an example of a power management apparatus to which the oscillator of one of the embodiments is applied.

FIG. 21 is a block diagram depicting an example of power management apparatus to which the oscillator of one of the embodiments is applied. The drawing depicts an entire structure of the power management apparatus to which the oscillator 2 of the first embodiment depicted in FIG. 4A described above is applied and in which an input voltage Vin from an energy harvester 1 is boosted and an output voltage Vo is applied to a load circuit 6.

The energy harvester (ultra-low voltage generation unit) 1 is, for example, a photovoltaic generator, an electromagnetic wave generator, a vibration power generator, a thermoelectric generator, or the like, and the voltage (input voltage) Vin from the energy harvester 1 is, for example, an ultra-low voltage of around from several tens to several hundreds of mV.

As depicted in FIG. 21, in power management apparatus 100 to which the oscillator of any one of the embodiments is applied, the oscillator 2 is adapted to continue oscillation operation and thus constantly consumes electric power. In FIG. 21, the voltage Vin from the energy harvester 1 is stored in a capacitor 10.

In the power management apparatus 100 depicted in FIG. 21, an auxiliary step-up unit 30 (oscillator 2) is used, for example, to generate a voltage Vdd (Vout) for driving a control circuit 5 during a period of time in which the main boost converter 4 does not output a predetermined power supply voltage Vo.

In other words, it is unnecessary to generate the driving voltage Vdd for the control circuit 5 when the output voltage Vo from the boost converter 4 reaches a predetermined voltage level as the control circuit 5 is allowed to utilize the output voltage Vo as the driving voltage.

Thus, it is preferable that the oscillator 2 has an OFF function (power down mode) to be turned OFF (stop of oscillation) when the boost converter 4 comes to generate an output voltage Vo that reaches a predetermined voltage level, so as to reduce power consumption of the power management apparatus 100 as a whole.

In oscillators and power management apparatuses of embodiments described below, the oscillator 20 is provided with a power down circuit to turn OFF the oscillator 20 when the boost converter 4 comes to generate a predetermined output voltage Vo, thereby eliminating power consumption by the oscillator 2.

Figure 22:
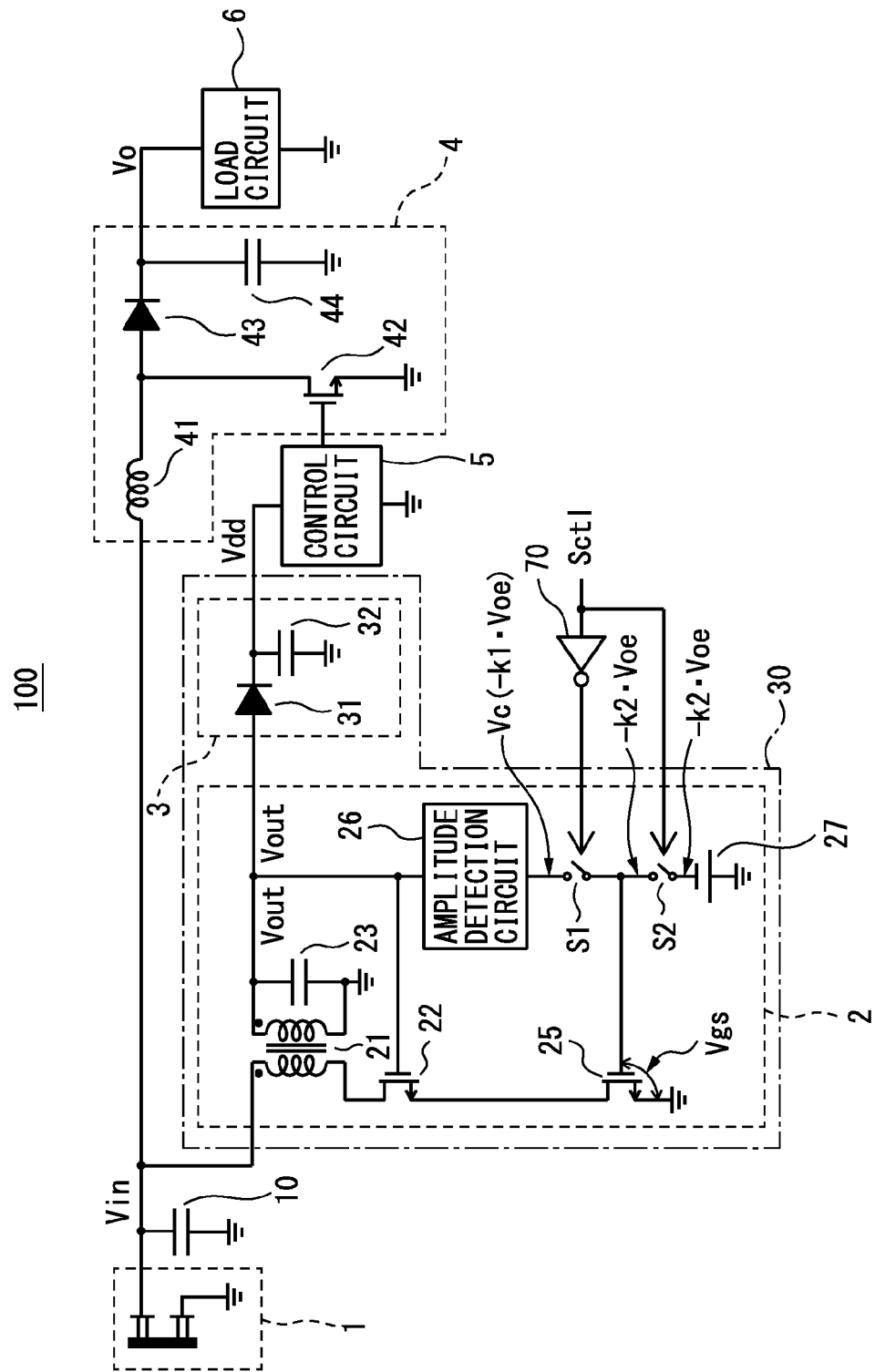
FIG. 22 is a block diagram depicting an example of power management apparatus to which an oscillator according to a thirteenth embodiment is applied.

FIG. 22 is a block diagram depicting an example of power management apparatus to which an oscillator according to a thirteenth embodiment is applied. Compared with FIG. 21 described above, the oscillator 2 of the thirteenth embodiment in FIG. 22 includes a first switch S1 interposed between the gate of a depletion or native nMOS transistor (second transistor) 25 and an amplitude detection circuit (current control circuit) 26. Additionally, a second switch S2 is interposed between the gate of the transistor 25 and a negative voltage supplier 27.

The switch S1 is controlled by a signal logically inverted from a power down control signal Sct1 by an inverter 70, whereas the switch S2 is directly controlled by the power down control signal Sct1. In other words, the switches S1 and S2 are turned ON or OFF complementarily by the power down control signal Sct1.

When the switch S2 is turned ON (the switch S1 is turned OFF), the negative voltage supplier 27 is used to sufficiently reduce a gate voltage Vgs of the transistor 25 to turn OFF the transistor 25 so as to stop oscillation operation of the oscillator 2. In addition, the switches S1 and S2 form a power down circuit.

Figure 23A:
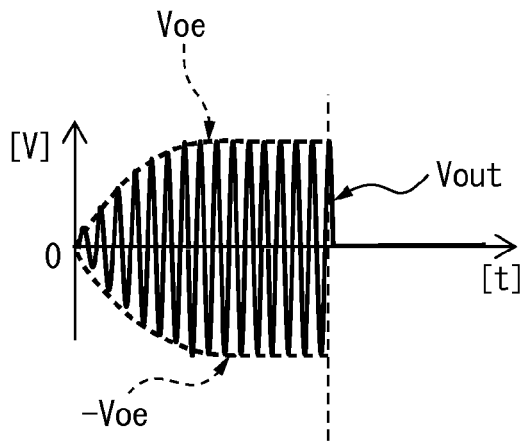
FIG. 23A, FIG. 23B, and FIG. 23C are graphs for illustrating operations of the oscillator depicted in FIG. 22.
Figure 23B:
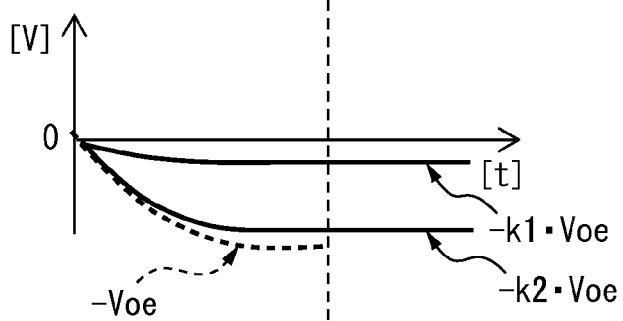
Figure 23C:
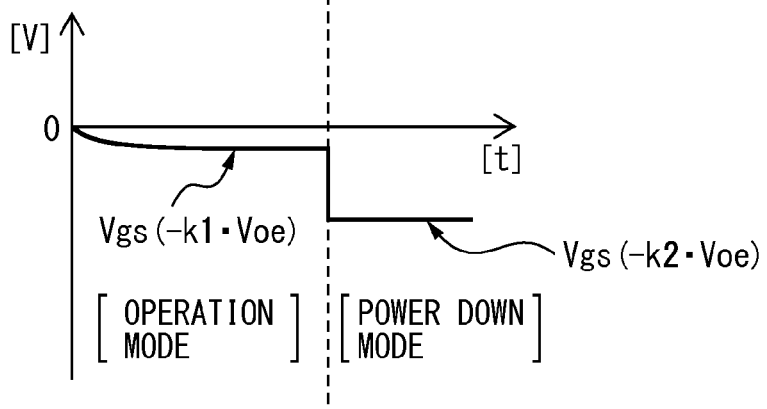

FIG. 23A, FIG. 23B, and FIG. 23C are graphs for illustrating operations of the oscillator of FIG. 22. FIG. 23A corresponds to FIG. 4B described above and depicts waveforms of an output voltage Vout in the oscillator 2 and envelope voltages Voe and −Voe thereof.

In addition, FIG. 23B depicts an output voltage Vc of the amplitude detection circuit 26 (a voltage of one end of the switch S1: −k1*Voe) and a voltage of the voltage level adjustment circuit 27 (a voltage of one end of the switch S2: −k2*Voe). The other ends of the switches S1 and S2 are connected to the gate of the transistor 25. In addition, coefficients k1 and k2 have a relationship represented by k1<k2.

Furthermore, FIG. 23C depicts gate voltages Vgs of the transistor 25 in an operation mode and a power down mode of the oscillator 2 (auxiliary step-up unit 30). The operation mode is a mode that allows the oscillator 2 to operate until the output voltage Vo in the boost converter 4 reaches a predetermined voltage level, and controls such that the switch S1 is turned ON and the switch S2 is turned OFF by a power down control signal Sct1.

The power down mode is a mode that stops operation of the oscillator 2 after the output voltage Vo from the boost converter 4 has reached a predetermined voltage level and achieved by turning off the switch S1 and turning on the switch S2 with a power down control signal Sct1.

In other words, as depicted in FIG. 22 and FIG. 23, during the operation mode, the switch S1 is ON and the switch S2 is OFF, whereby the gate voltage Vgs of the transistor 25 becomes an output voltage Vc (−k1*Voe) of the amplitude detection circuit 26 and the oscillation operation described above is performed.

On the other hand, during the power down mode, the switch S1 is OFF and the switch S2 is ON, whereby the gate voltage Vgs of the transistor 25 becomes a voltage (−k2*Voe) of the voltage level adjustment circuit 27 and the transistor 25 is turned OFF, thus stopping the oscillation operation of the oscillator 2.

The power down control signal Sct1 can be given outside the oscillator 2. The power down control signal Sct1, for example, would turn ON the switch S2 (turn OFF the switch S1) to stop the oscillation operation of the oscillator 2 when the power output voltage Vo in the boost converter 4 reaches a predetermined voltage level.

Additionally, the power down control signal Sct1, for example, may cause a timer to measure a time in which the power supply voltage Vo from the boost converter 4 is expected to reach a predetermined voltage level, and may turn ON the switch S2 (turns OFF the switch S1) to stop the oscillation operation of the oscillator 2 after the time has passed.

As described above, in the oscillator of the thirteenth embodiment, when the boost converter 4 comes to generate the output voltage Vo above the predetermined voltage level, oscillation of the oscillator 2 is stopped, thereby achieving a reduction in power consumption of the power management apparatus 100 as a whole. The effect of the thirteenth embodiment is similarly exhibited in the following respective embodiments.

While FIG. 22 uses the oscillator of the first embodiment depicted in FIG. 4 as the oscillator 2, any one of the oscillators of the second through the twelfth embodiments can be similarly applied as the oscillator 2. In those cases, depending on conductivity types of the transistors 22 and 25, positions therefor, and the like in the oscillator 2, various modifications and changes of the voltage level adjustment circuit 27 and the like will be made.

Figure 24:
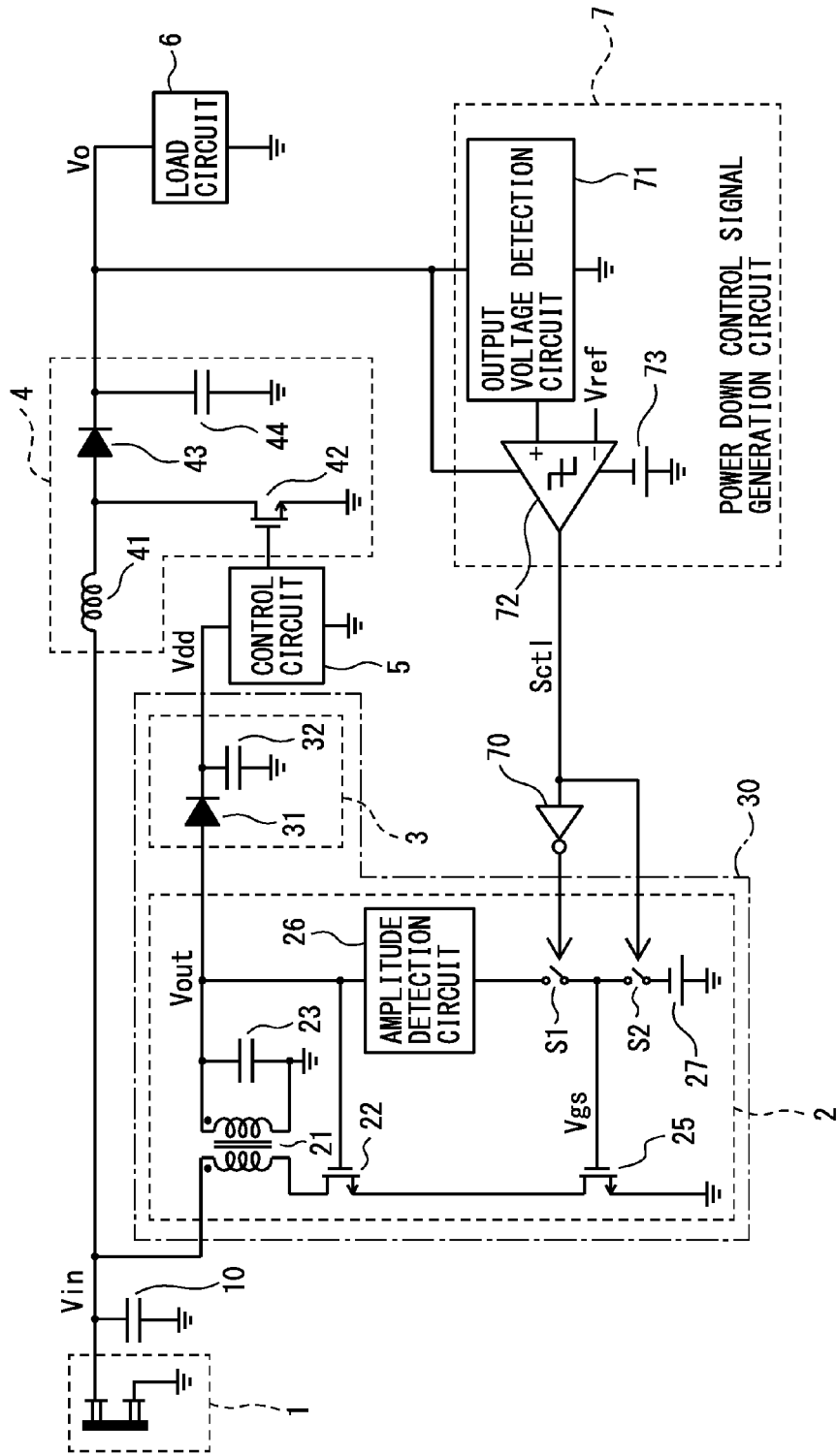
FIG. 24 is a block diagram depicting an example of power management apparatus to which an oscillator according to a fourteenth embodiment is applied.

FIG. 24 is a block diagram depicting an example of power management apparatus to which an oscillator according to a fourteenth embodiment is applied. Compared with FIG. 22 described above, power management apparatus 100 incorporating the oscillator of the fourteenth embodiment in FIG. 24 includes a power down control signal generation circuit 7 for generating a power down control signal Sct1.

The power down control signal generation circuit 7 includes a power supply voltage detection circuit 71 for detecting an output voltage Vo in a boost converter 4 and a comparator 72 for comparing an output (voltage) of the output voltage detection circuit 71 with a reference voltage Vref to generate a power down control signal Sct1.

Furthermore, the power down control signal generation circuit 7 includes a voltage level adjustment circuit 73 for adjusting a voltage level of the power down control signal Sct1 generated from the comparator 72. In addition, an inverter 70 can be considered to be also included in the power down control signal generation circuit 7. Other structural features are the same as those of FIG. 22 described above or those of the respective embodiments described above, and thus description thereof will be omitted.

In the fourteenth embodiment, the power down control signal Sct1 from the comparator 72 is at a first level (for example, a high level "H") for turning ON the switch S1 (turning OFF the switch S2) until the output voltage Vo in the boost converter 4 reaches a predetermined voltage level. This causes the gate voltage Vgs of the transistor 25 to be an output voltage Vc (−k1*Voe) of the amplitude detection circuit 26, whereby the oscillator goes into an operation mode to perform oscillation operation.

In addition, the power down control signal Sct1 from the comparator 72 goes to a second level (for example, a low level "L") for turning OFF the switch S1 (turning ON the switch S2) when the output voltage Vo in the boost converter 4 goes to a predetermined voltage level. Thereby, the gate voltage Vgs of the transistor 25 becomes a voltage (−k2*Voe) of the voltage level adjustment circuit 27, whereby the transistor is turned OFF and the oscillator 2 goes into a power down mode to stop oscillation operation.

Figure 25:
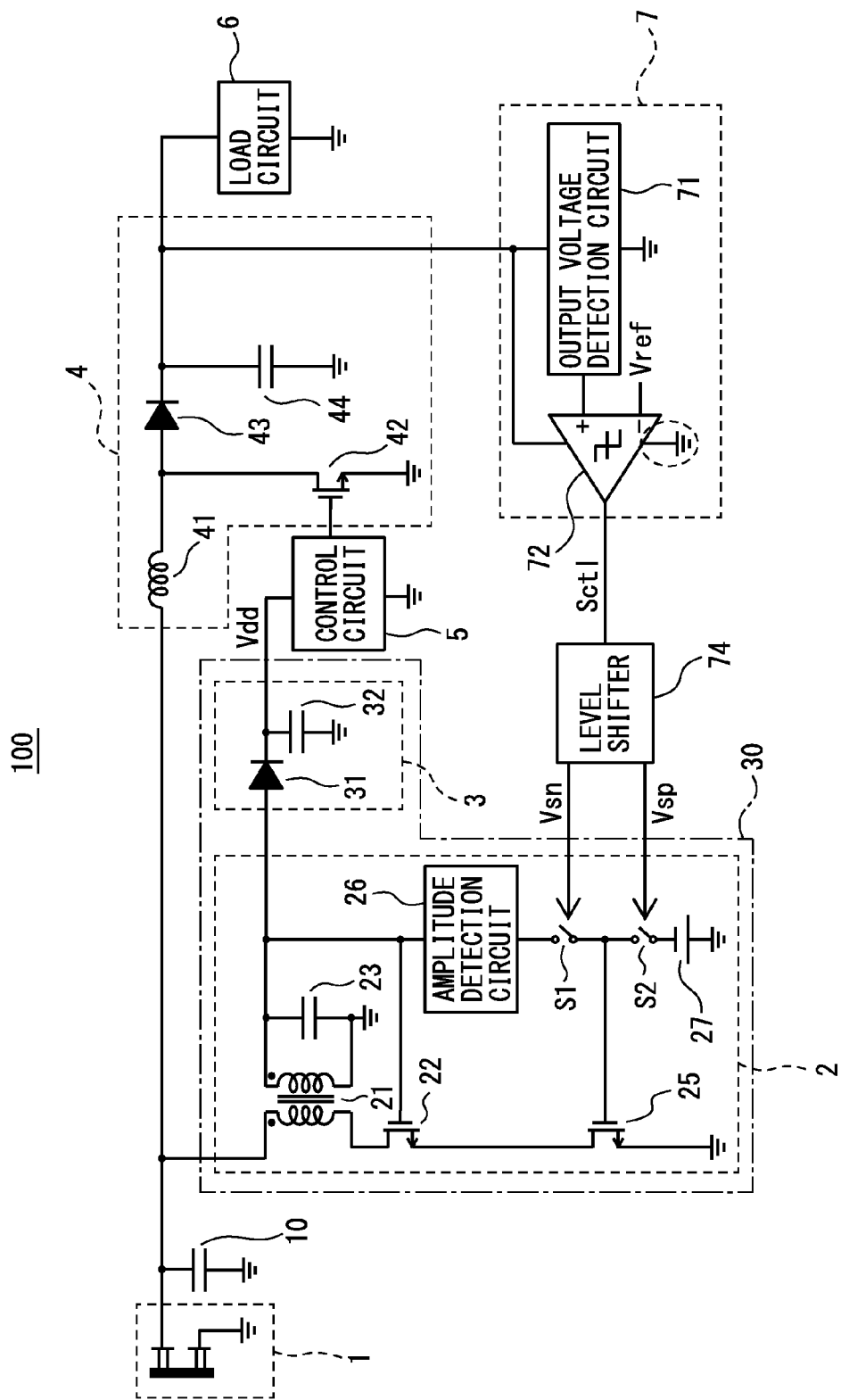
FIG. 25 is a block diagram depicting an example of power management apparatus to which an oscillator according to a fifteenth embodiment is applied.

FIG. 25 is a block diagram depicting an example of power management apparatus to which an oscillator according to a fifteenth embodiment is applied. Compared with FIG. 24 described above, the power down control signal generation circuit 27 in the power management apparatus incorporating the oscillator of the fifteenth embodiment includes a level shifter 74 for shifting a voltage level of the power down control signal Sct1.

The level shifter 74 (level shift circuit) can be considered to be included in the power down control signal generation circuit 7. It is possible to group the level shifter 74, the oscillator 2, the rectifier circuit 3, and the like together as the auxiliary step-up unit 30.

Figure 26A:
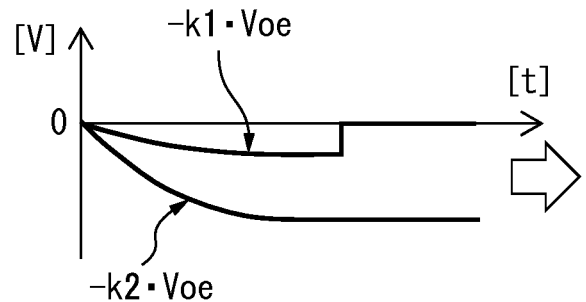
FIG. 26A, FIG. 26B, and FIG. 26C are graphs for illustrating an operation of the oscillator depicted in FIG. 25.
Figure 26B:
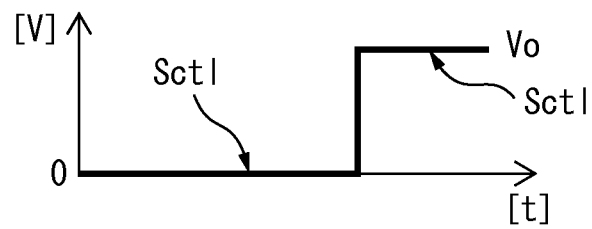
Figure 26B:
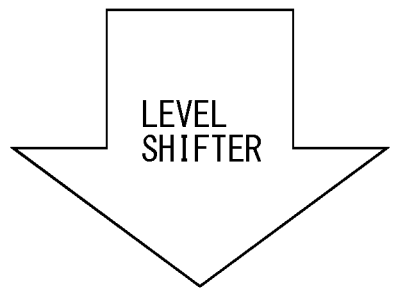
Figure 26C:
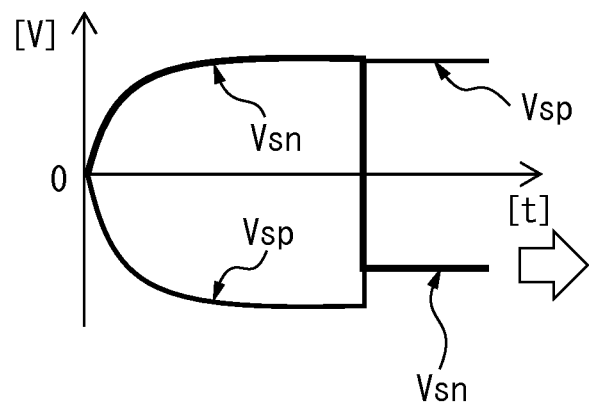

FIG. 26A, FIG. 26B, and FIG. 26C are graphs for illustrating operations of the oscillator depicted in FIG. 25. FIG. 26A depicts gate voltages Vgs of the transistor 25; FIG. 26B depicts a power down control signal Sct1; and FIG. 26C depicts output signals (voltages) Vsn and Vsp of the level shifter 74.

In the power management apparatus incorporating the oscillator of the fourteenth embodiment described above, a ground potential of the comparator 72 is an absolute ground potential through the voltage level adjustment circuit 73. On the other hand, in the power management apparatus incorporating the oscillator of the present fifteenth embodiment, the ground potential of the comparator 72 is set to be an absolute ground to stabilize the comparator 72.

In other words, as depicted in FIG. 26B, an output signal (power down control signal Sct1) of the comparator 72 can be a signal ranging, for example, from 0 V to Vo. Then, the level shifter 74 shifts the level of the power down control signal Sct1 as in FIG. 26B to output signals Vsn and Vsp equal to or less than 0 V, as in FIG. 6C, and outputs the signals.

The output signal Vsn is used to turn ON or OFF the switch S1, and the output signal Vsp is used to turn ON or OFF the switch S2. The description above is applied to the switches S1 and S2 of nMOS transistors. When the switches S1 and S2 are pMOS transistors, positive and negative levels will be reversed.

Figure 27:
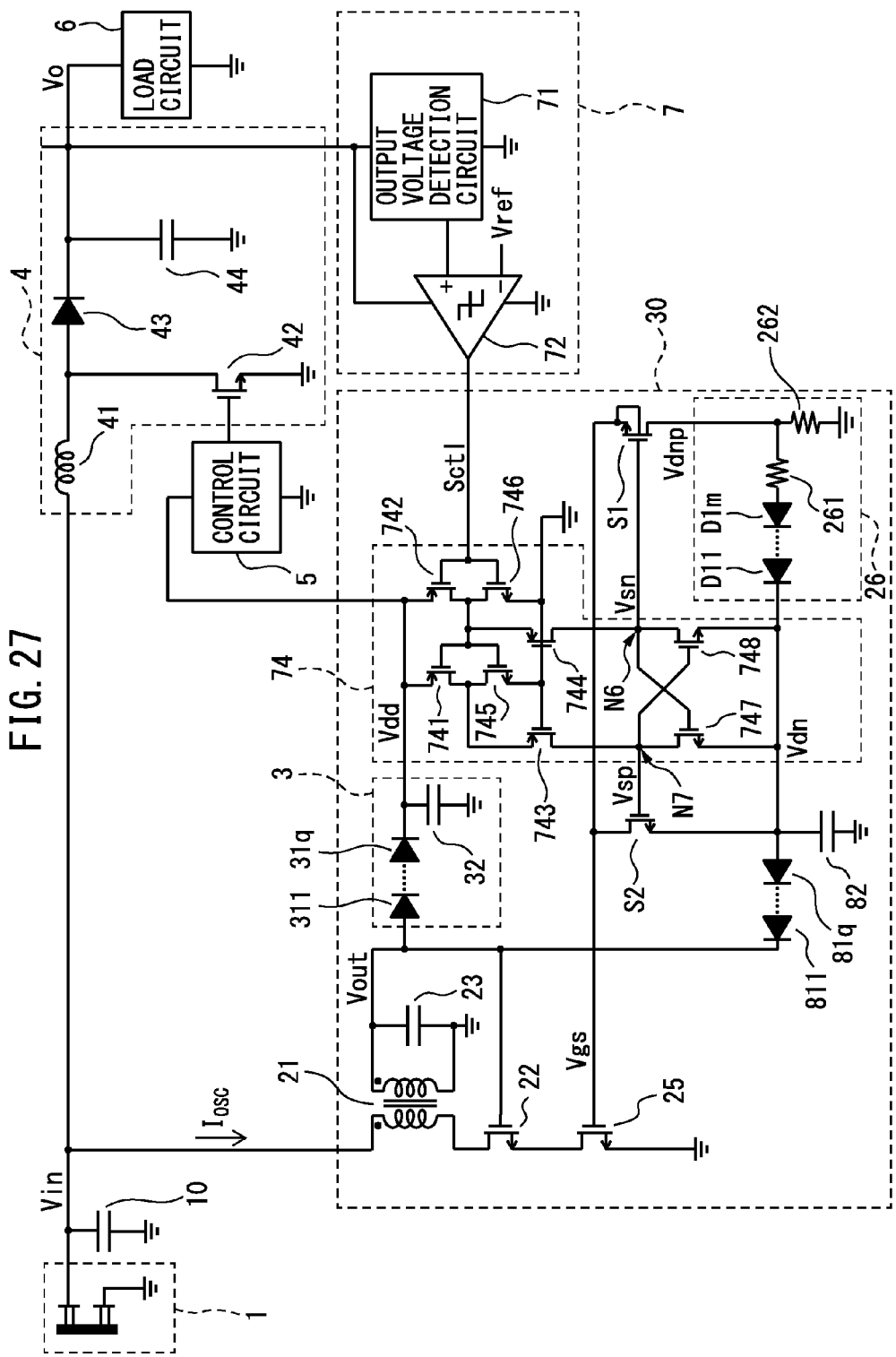
FIG. 27 is a block diagram depicting a more detailed example of the power management apparatus depicted in FIG. 25.
Figure 28:
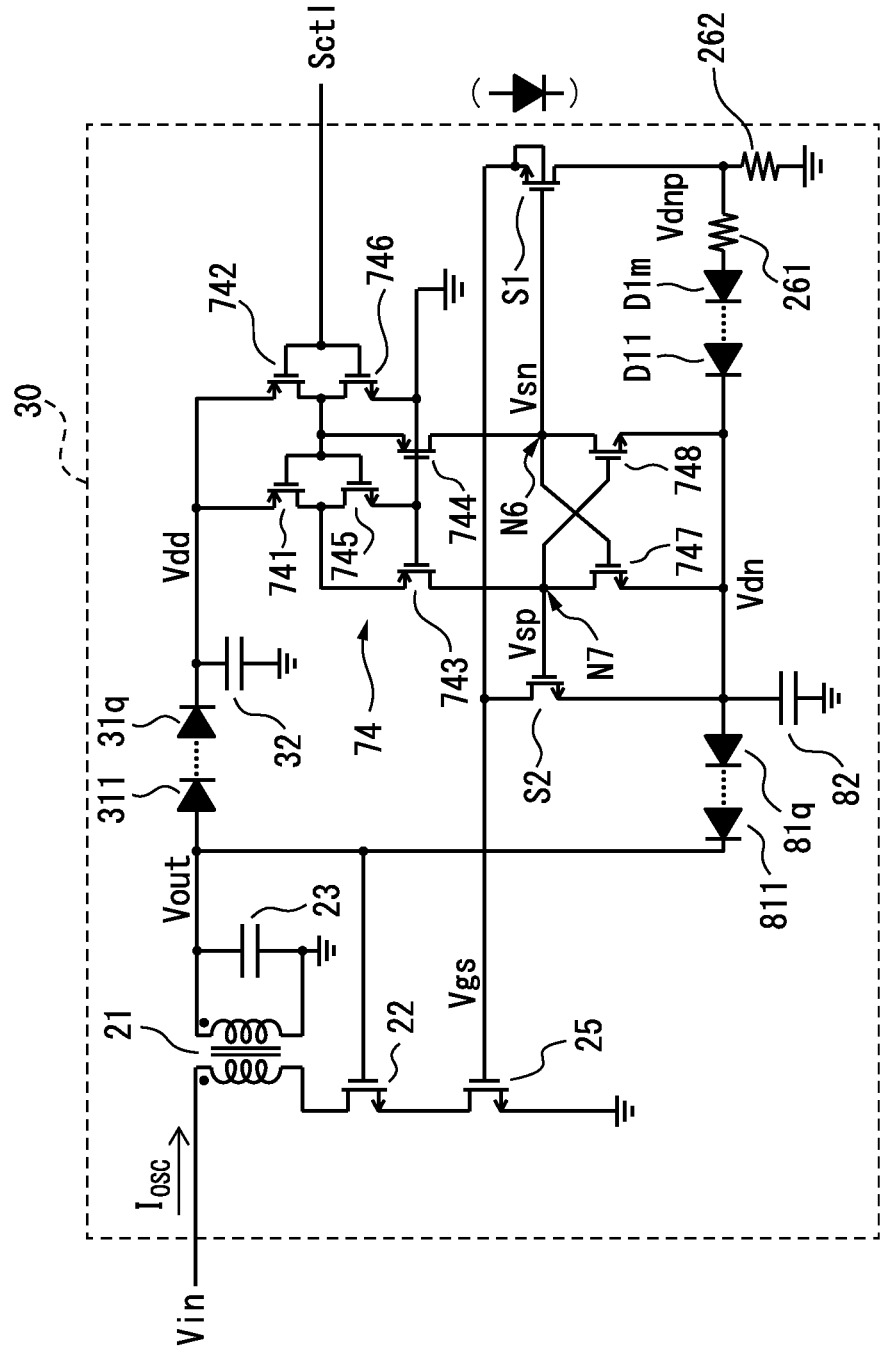
FIG. 28 is a circuit diagram of the oscillator extracted from FIG. 27.

FIG. 27 is a block diagram depicting details of the example of the power management apparatus depicted in FIG. 25, in which the level shifter 74, the oscillator 2, the rectifier circuit 3, and the like are grouped together as the auxiliary step-up unit 30. FIG. 28 is a circuit diagram depicting the oscillator 2 (auxiliary step-up unit 30) extracted from FIG. 27. FIG. 29A, FIG. 29B, FIG. 29C, FIG. 29D, and FIG. 29E are graphs for illustrating operations of the oscillator 2 depicted in FIG. 28.

Figure 29A:
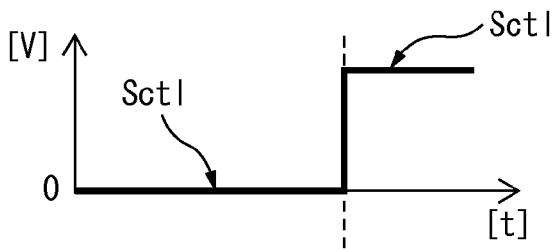
FIG. 29A, FIG. 29B, FIG. 29C, FIG. 29D, and FIG. 29E are graphs for illustrating operations of the oscillator depicted in FIG. 28.
Figure 29B:
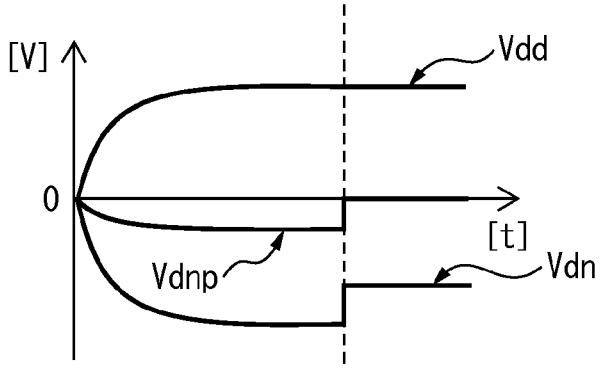
Figure 29C:
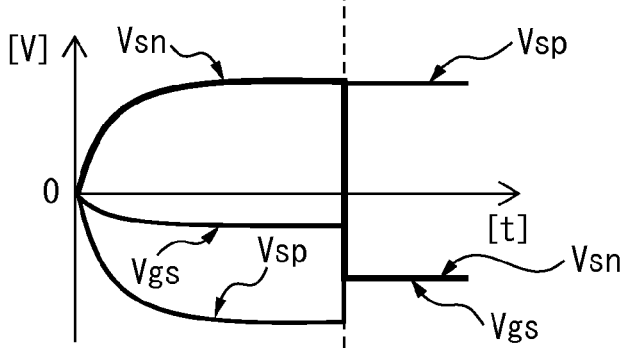
Figure 29D:
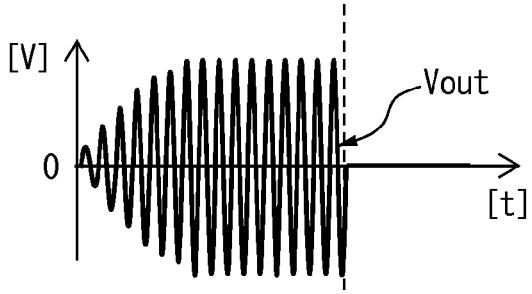
Figure 29E:
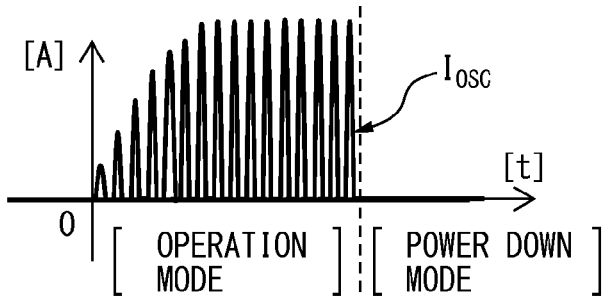

FIG. 29A depicts a power down control signal Sct1, and FIG. 29B depicts respective voltages Vdd, Vdn, and Vnp. Additionally, FIG. 29C depicts a gate voltage Vgs of the transistor 25 and output voltages Vsn and Vsp of the level shifter 74 (gate voltages of the transistors (switches) S1 and S2). FIG. 29D depicts an output voltage Vout of the oscillator 2, and FIG. 29E depicts an input current Iosc of the oscillator 2.

As depicted in FIG. 27, the level shifter 74 includes pMOS transistors 741 to 744 and nMOS transistors 745 to 748. The transistors 741 and 745 and transistors 742 and 746, respectively, form inverters, and transistors 747 and 748 form a latch. In addition, the switches S1 and S2, respectively, are nMOS transistors.

An output signal Vsn of the level shifter 74 is applied to the gate of the transistor (switch) S1. The output signal Vsn is a signal extracted from a common connection node N6 of the gate of transistor 747 and the drain of transistor 748.

Furthermore, an output signal Vsp of the level shifter 74 is applied to the gate of transistor S2. The output signal Vsp is a signal extracted from a common connection node N7 of the gate of transistor 748 and the drain of transistor 747.

The backgate and source node of the nMOS transistor S1 are connected to the gate node of transistor (second transistor) 25 to prevent current leakage by a parasitic component of the nMOS transistor during the power down mode.

In other words, during the power down mode, the transistor S1 is not only turned OFF but serves as a reverse biased parasitic diode, thereby reducing leak current and avoid wasteful power consumption.

The level shifter 74 receives, from the output voltage Vout of the oscillator 2, a positive voltage Vdd generated by a rectifier circuit 3 (diodes 311 to 31$q$ and a capacitor 32) and a negative voltage Vdn generated by a rectifier circuit 8 (diodes 811 to 81$q$ and a capacitor 82).

The positive voltage Vdd is applied to a control circuit 5 for controlling a boost converter 4 and also applied to sources of transistors 741 and 742 (the inverter of 741 and 745 and the inverter of 742 and 746).

The negative voltage Vdn is applied to sources of the transistors 747 and 748 in the level shifter 74 and a cathode of a diode D11 in m pieces of cascade-connected diodes D11 to D1$m$ to form an amplitude detection circuit 26.

The numbers of stages (numbers of q) in the q pieces of the cascade-connected diodes 311 to 31$q$ and the q pieces of the cascade-connected diodes 811 to 81$q$, in the respective rectifier circuits 3 and 8 are set to be less than the number of stages (number of m) of the m pieces of the cascade-connected diodes D11 to D1$m$ in the amplitude detection circuit 26. Specifically, for example, q=1 and m=4 are preferable.

A voltage Vdnp of the drain of the transistor S1 (a common connection node of the resistors 261 and 262) is generated as a higher voltage than the negative voltage Vdn by dividing the negative voltage Vdn by the resistors 261 and 262.

With reference to FIG. 29A to FIG. 29C, when operation is switched from the operation mode to the power down mode, for example, the power down control signal Sct1 rises from 0 V up to around from 2 to 3 V, whereby the transistor S1 is turned OFF and the transistor S2 is turned ON. In the power down mode, the output voltage Vout of the oscillator 2 is, for example, around 2 V, and the gate voltage Vgs of the transistor 25 is, for example, Vdn (−1 V or less).

Thereby, the output voltage Vout of the oscillator 2 becomes 0 V, as depicted in FIG. 29D, and additionally, the input current Iosc of the oscillator 2 becomes 0 [A], as depicted in FIG. 29E. In other words, the current Iosc to the oscillator 2 from the energy harvester 1 becomes 0, thus, no current therefrom is consumed by the oscillator 2. Therefore, current (electric power) from the energy harvester 1 is effectively boosted to a supply voltage Vo for the load circuit and control circuit by the boost converter 4 and then output.

Figure 30:
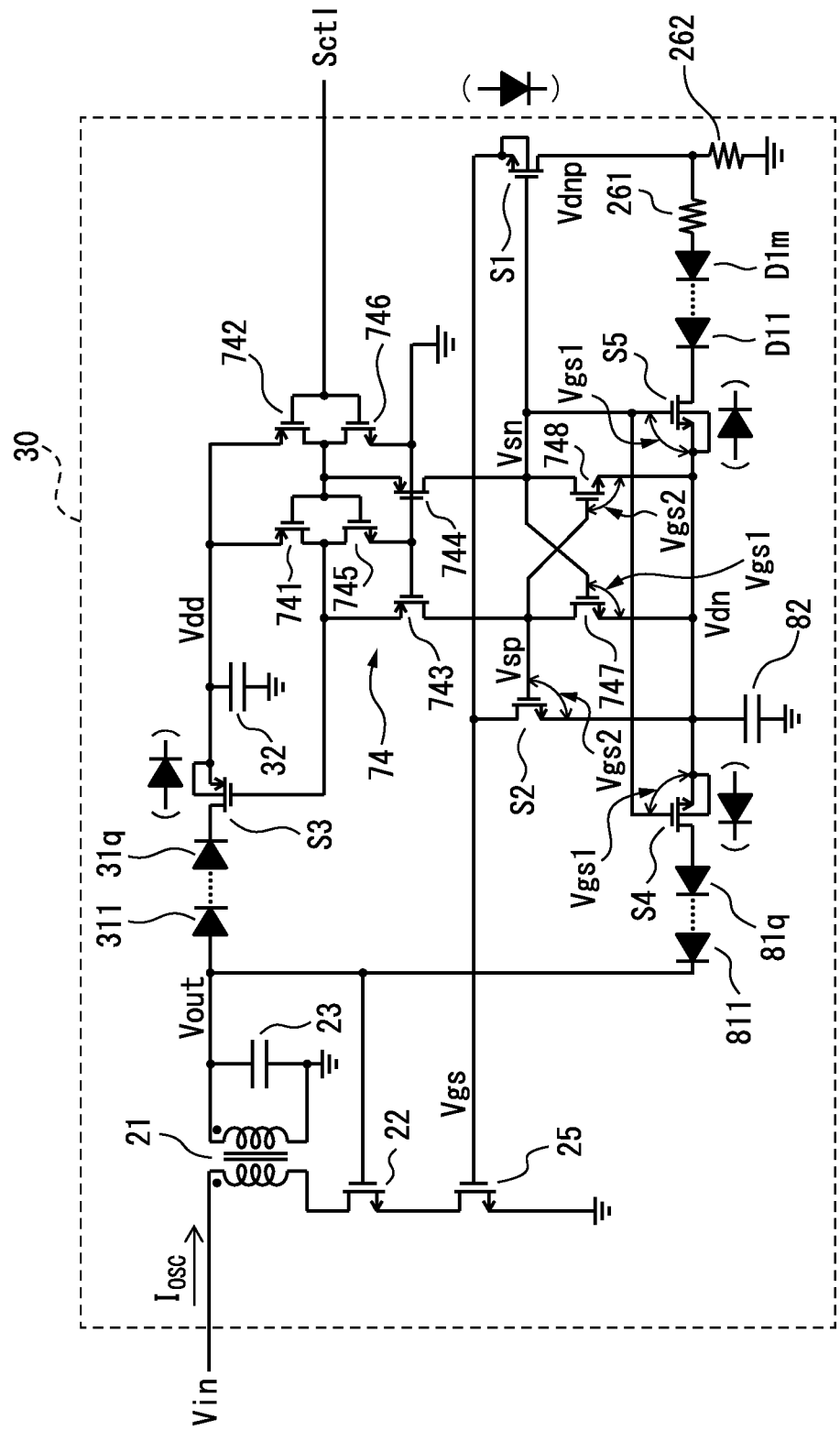
FIG. 30 is a circuit diagram depicting an oscillator according to a sixteenth embodiment.

FIG. 30 is a circuit diagram depicting an oscillator according to a sixteenth embodiment. Compared with FIG. 28 described above, the oscillator of the sixteenth embodiment is formed by adding switches S3 to S5 to the fifteenth embodiment.

The switch S3 is a pMOS transistor whose backgate and source are commonly connected, and the switches S4 and S5, respectively, are nMOS transistors whose backgates and sources are commonly connected.

The transistor S3 is arranged between the cathode of diode 31$q$ and one end of the capacitor 32, and the transistor S4 is arranged between the anode of diode 81$q$ and one end of the capacitor 82. In addition, the transistor S5 is arranged between the cathode of diode D11 and one end of the capacitor 32, and the other ends of the capacitors 32 and 82 are connected to the ground.

A power down control signal Sct1 is input to the gate of transistor S3 through the two inverters (the inverter of 742 and 726 and the inverter of 741 and 745). An output signal Vsn of the level shifter 74 is input to the gates of transistors S4 and S5. Then, the transistors S3 to S5 are adapted to serve as parasitic diodes indicated in parentheses of FIG. 30 when turned OFF.

In other words, upon the power down mode, the power down control signal Sct1 goes to a high level "H" and the transistors S3 to S5 are turned OFF. At this time, electric charges stored in the capacitors 32 and 82 are maintained, without leaking, by the transistors S3 to S5 serving as reverse biased diodes. This allows suppresses current leakage through the level shifter 74, thus leading to reduction in power consumption.

Figure 31:
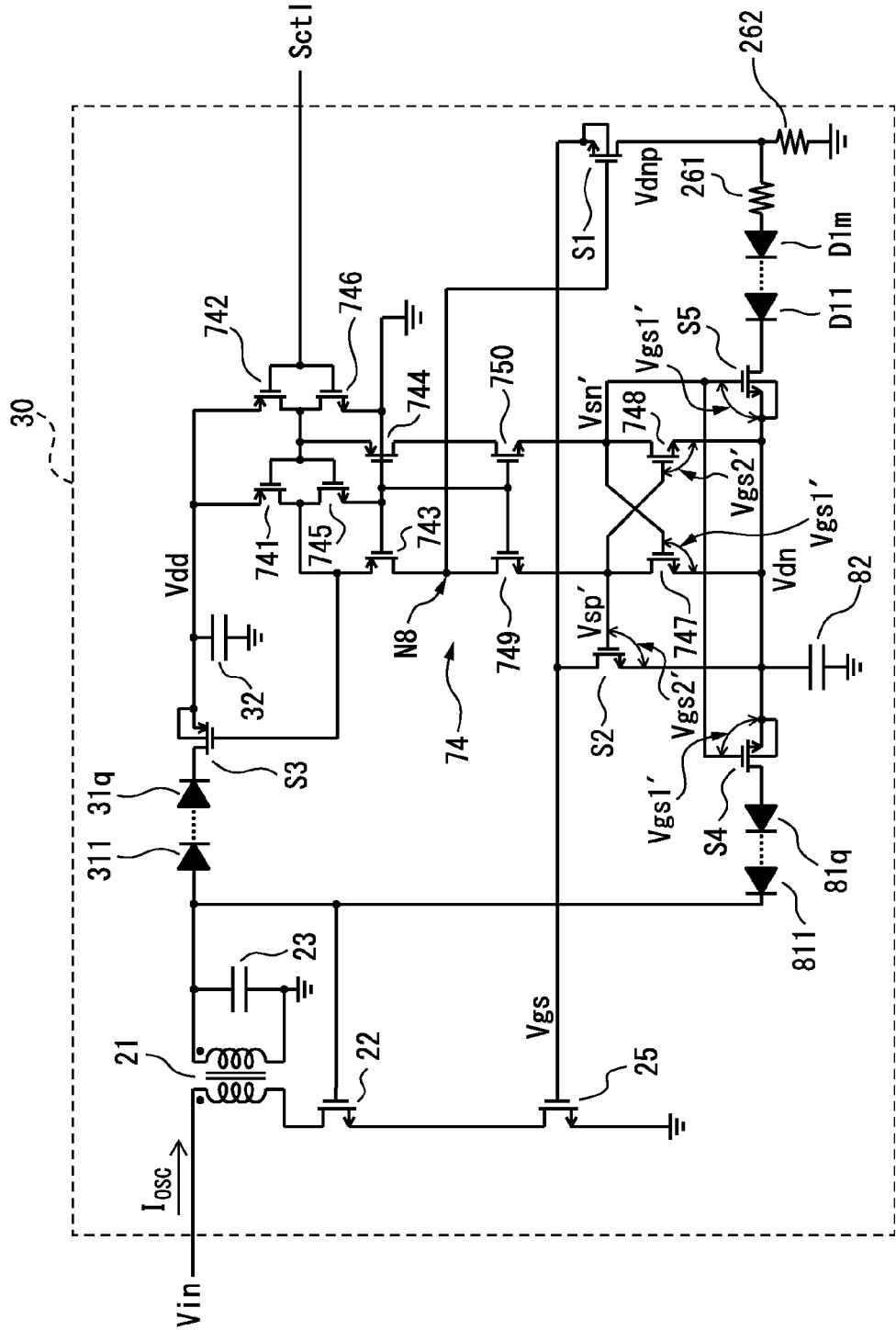
FIG. 31 is a circuit diagram depicting an oscillator according to a seventeenth embodiment.
Figure 32A:
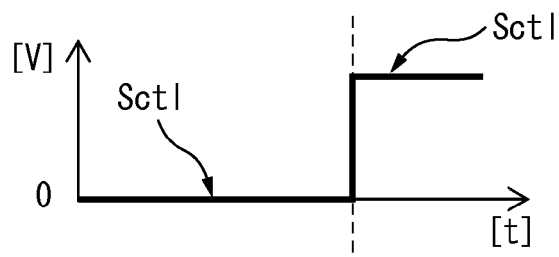
FIG. 32A, FIG. 32B, FIG. 32C, and FIG. 32D are graphs for illustrating operations of the oscillator depicted in FIG. 31.
Figure 32B:
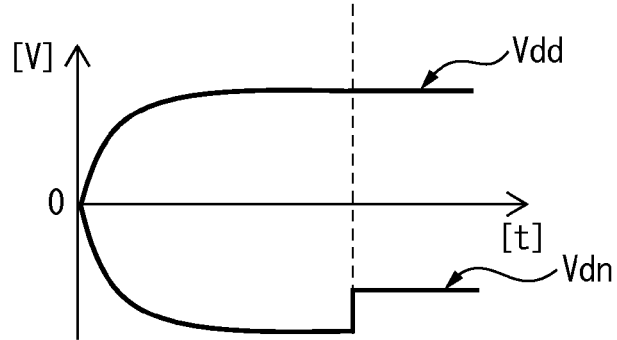

FIG. 31 is a circuit diagram depicting an oscillator according to a seventeenth embodiment. FIG. 32A, FIG. 32B, FIG. 32C, and FIG. 32D are graphs for illustrating operations of the oscillator depicted in FIG. 31. FIG. 32A depicts a power down control signal Sct1, and FIG. 32B depicts a positive voltage Vdd and a negative voltage Vdn.

Figure 32C:
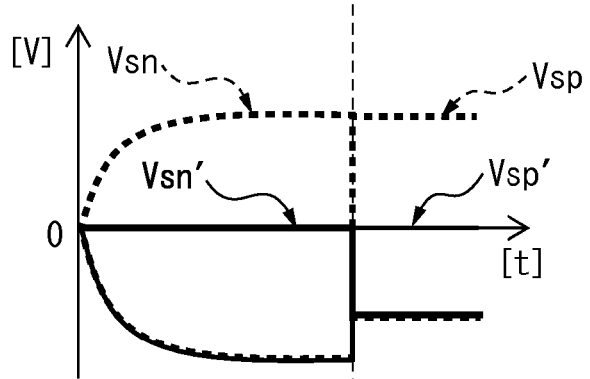
Figure 32D:
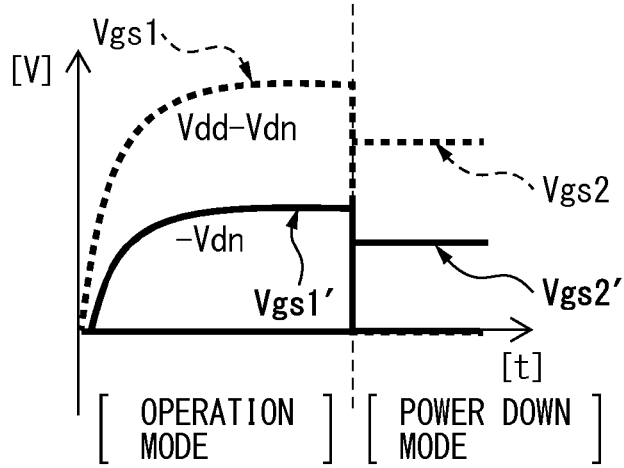

In addition, FIG. 32C depicts voltages Vsn and Vsp in the circuit of FIG. 30 and voltages Vsn' and Vsp' in the circuit of FIG. 31. FIG. 32D depicts voltages Vgs1 and Vgs2 in the circuit of FIG. 30 and voltages Vgs1' and Vgs2' in the circuit of FIG. 31.

Compared with FIG. 30 described above, the oscillator of the seventeenth embodiment illustrated in FIG. 31 is formed by adding a pair of nMOS transistors 749 and 750 to the sixteenth embodiment. In other words, as depicted in FIG. 31, respective nMOS transistors (protection transistors) 749 and 750 are interposed between the drains of the pMOS transistors 743 and 744 and drains of the nMOS transistors 747 and 748.

Gates of the transistors 749 and 750 are connected to the ground node, and the gate of the transistor S1 is connected to a node N8 to which drains of the transistors 743 and 749 are commonly connected.

In other words, as depicted in FIG. 32A to FIG. 32D, in the auxiliary step-up unit 30 (level shifter 74) depicted in FIG. 30 described above, for example, in an operation mode, the maximum value of gate-source (drain) voltages Vgs1 of the transistors 747, S4, and S5 become Vdd−Vdn. When such a large potential difference between the positive voltage Vdd and the negative voltage Vdn is imposed directly on the gates and sources of the transistors 747, S4, and S5, these transistors may be broken.

In contrast, the auxiliary step-up unit 30 depicted in FIG. 31 includes a pair of transistors 749 and 750. Thereby, for example, in the operation mode, the maximum value of gate-source voltages Vgs1' of the transistors 747, S4, and S5 can be reduced to −Vdn. In other words, the problem of excessive voltage can be solved.

In the circuit depicted in FIG. 31, for example, the voltages Vsn', Vsp', Vgs1', and Vsg2' in the power down mode are different from the voltages Vsn, Vsp, Vgs1, and Vgs2 of the circuit of FIG. 30, as depicted in FIG. 32C and FIG. 32D. There is, however, no problem in the operation of the circuit.

Figure 33:
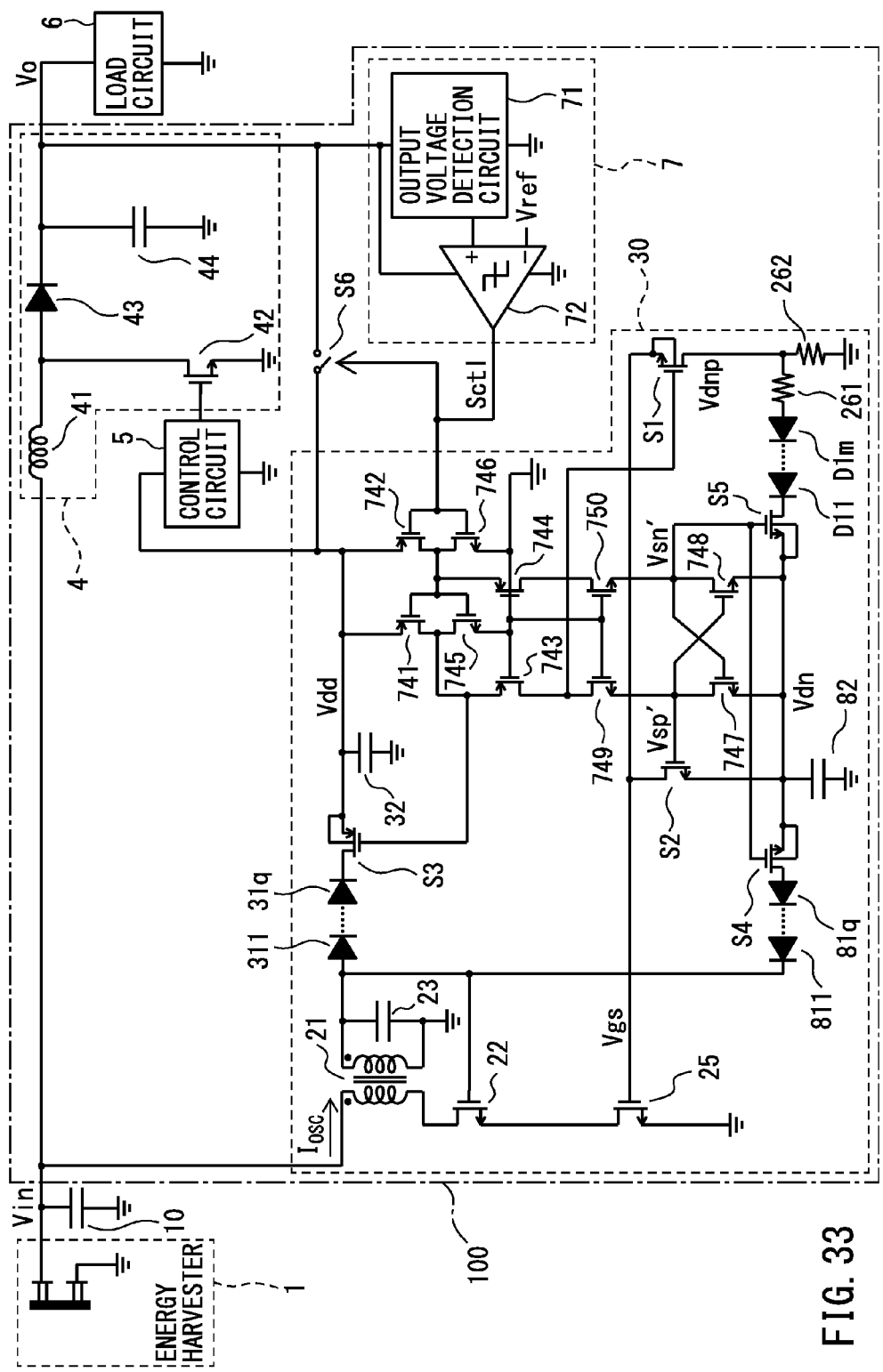
FIG. 33 is a block diagram depicting an example of power management apparatus to which the oscillator of the seventeenth embodiment is applied.

FIG. 33 is a block diagram depicting an example of power management apparatus to which an oscillator according to a seventeenth embodiment is applied. As depicted in FIG. 33, power management apparatus 100 includes a boost converter 4, an auxiliary step-up unit 30 including an oscillator 2 and a rectifier circuit 3, a control circuit 5 for receiving a voltage from the auxiliary step-up unit 30 to control the boost converter 4, and a power down control signal generation circuit 7.

The power management apparatus depicted in FIG. 33 is provided with a switch S6. Then, when the output voltage Vo of boost converter 4 reaches a predetermined voltage level, only the boost converter 4 is allowed to operate and the switch S6 is turned OFF by the power down control signal Sct1.

As depicted in FIG. 32A to FIG. 32D, the power management apparatus could be formed, for example, on a single semiconductor chip 100 and can be provided as a semiconductor device to users.

While the thirteenth through the seventeenth embodiments have been described mainly based on the oscillator 2 of the first embodiment depicted in FIG. 4A, the arrangements of the transistors 22 and 25, the structure of the amplitude detection circuit 26, and the like can be selected from various options including the second through the twelfth embodiments.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

Regarding aspects of the invention including the above embodiments, following items will be additionally disclosed.

(Item 1) An oscillator comprising:
a transformer including a primary winding configured to receive an input voltage and a secondary winding configured to boost the input voltage to generate an output voltage;
a first capacitor configured to form an LC resonant circuit together with the secondary winding to cause oscillation;
a first transistor connected in series with the primary winding, the output voltage being applied to a control terminal of the first transistor;
a depletion or native second transistor connected in series with the primary winding and the first transistor; and
a current control circuit configured to adjust a control voltage applied to a control terminal of the second transistor to control a current flowing through the first winding.

(Item 2) The oscillator according to item 1, wherein the first transistor is a depletion or native transistor.

(Item 3) The oscillator according to item 1, wherein the first capacitor is connected to a first node to which a first terminal of the secondary winding is connected and a second node to which a second terminal of the secondary winding is connected, and the output voltage is output from the first node.

(Item 4) The oscillator according to item 1, wherein the second transistor is larger in size than the first transistor.

(Item 5) The oscillator according to item 3, wherein the current control circuit includes at least one diode and a second capacitor connected in series between the first node and the second node.

(Item 6) The oscillator according to item 5, wherein the current control circuit further includes a first resistor arranged between the second node and a third node which is an intermediate node between at least one diode and the second capacitor.

(Item 7) The oscillator according to item 6, wherein the first resistor includes a second resistor and a third resistor connected in series, a control voltage applied to the control terminal of the second transistor being extracted from a fourth node connecting both the second resistor and the third resistor.

(Item 8) The oscillator according to item 5, wherein the current control circuit has a symmetrical circuit structure.

(Item 9) The oscillator according to item 1, wherein the transformer is arranged between the first transistor and the second transistor.

(Item 10) The oscillator according to item 9, wherein the first transistor and the second transistor are MOS transistors of the same conductivity type.

(Item 11) The oscillator according to item 9, wherein the first transistor and the second transistor are MOS transistors of different conductivity types.

(Item 12) The oscillator according to item 11, wherein the second transistor is a depletion or native pMOS transistor arranged on a high potential side of the input voltage and the first transistor is a depletion or native nMOS transistor arranged on a low potential side of the input voltage.

(Item 13) The oscillator according to item 11, wherein the second transistor is a depletion or native nMOS transistor arranged on a low potential side of the input voltage and the first transistor is a depletion or native pMOS transistor arranged on a high potential side of the input voltage.

(Item 14) The oscillator according to item 1, wherein the first transistor and the second transistor are directly connected to each other.

(Item 15) The oscillator according to item 14, wherein the first transistor and the second transistor are MOS transistors of the same conductivity type.

(Item 16) The oscillator according to item 15, wherein the first transistor and the second transistor are depletion or native pMOS transistors arranged on a positive potential side of the input voltage, the second transistor being arranged between the first transistor and the transformer.

(Item 17) The oscillator according to item 15, wherein the first transistor and the second transistor are depletion or native nMOS transistors arranged on a negative potential side of the input voltage, the second transistor being arranged between the first transistor and the transformer.

(Item 18) The oscillator according to item 14, wherein the first transistor and the second transistor are MOS transistors of different conductivity types.

(Item 19) The oscillator according to item 1, wherein the primary winding and the secondary winding are wound so as to have a same polarity.

(Item 20) The oscillator according to item 1, wherein the primary winding and the secondary winding are wound so as to have different polarities.

(Item 21) The oscillator according to item 1, wherein the input voltage is an ultra-low voltage generated by an ultra-low voltage generation unit.

(Item 22) The oscillator according to item 21, wherein the ultra-low voltage generation unit is a source configured to generate the ultra-low voltage by energy harvesting with a photovoltaic electricity generator, an electromagnetic wave electricity generator, a vibration electricity generator, or a thermoelectric generator.

(Item 23) The oscillator according to item 1, further comprising a power down circuit configured to control oscillation operation according to whether or not the control voltage from the current control circuit is applied to the control terminal of the second transistor.

(Item 24) The oscillator according to item 23, wherein the power down circuit includes a first switching element arranged between the control terminal of the second transistor and the current control circuit and turned ON or OFF by a power down control signal, and a second switching element arranged between the control terminal of the second transistor and a node to which a predetermined potential is applied and turned ON or OFF complementarily with respect to the first switching element by the power down control signal.

(Item 25) A power management apparatus comprising:
a boost converter configured to generate a power supply voltage applied to a load circuit from an ultra-low voltage generated by an ultra-low voltage generation unit;
an auxiliary step-up unit including an oscillator and a rectifier circuit configured to rectify an output voltage of the oscillator; and
a boost converter control circuit configured to receive the voltage from the auxiliary step-up unit to control the boost converter, wherein the oscillator comprises:
  a transformer including a primary winding configured to receive an input voltage and a secondary winding configured to boost the input voltage to generate an output voltage;
  a first capacitor configured to form an LC resonant circuit together with the secondary winding to cause oscillation operation;
  a first transistor connected in series with the primary winding, the output voltage being applied to a control terminal of the first transistor;
  a depletion or native second transistor connected in series with the primary winding and the first transistor;
  a current control circuit configured to adjust a control voltage applied to a control terminal of the second transistor to control a current flowing through the first winding; and
  a power down circuit configured to control oscillation operation according to whether or not the control voltage from the current control circuit is applied to the control terminal of the second transistor.

(Item 26) The power management apparatus according to item 25, wherein the power down control signal is input from outside the oscillator.

(Item 27) The power management apparatus according to item 26, wherein until the output voltage from the boost converter reaches a predetermined voltage level, the power down control signal is set to be a first level at which the first switching element is turned ON and the second switching element is turned OFF so that the oscillator performs oscillation operation, and when the output voltage from the boost converter reaches the predetermined voltage level or after the passage of a time during which the power supply voltage from the boost converter is expected to reach the predetermined voltage level, the power down control signal is set to be a second level different from the first level at which the first switching element is turned OFF and the second switching element is turned ON so that the oscillator stops the oscillation operation.

(Item 28) The power management apparatus according to item 25, further comprising a power down control signal generation circuit configured to generate the power down control signal, wherein until the output voltage from the boost converter reaches a predetermined voltage level, the power down control signal generation circuit sets the power down control signal to a first level at which the first switching element is turned ON and the second switching element is turned OFF so that the oscillator performs oscillation operation, and when the output voltage from the boost converter reaches the predetermined voltage level, the power down control signal generation circuit sets the power down control signal to a second level different from the first level at which the first switching element is turned OFF and the second switching element is turned ON so that the oscillator stops the oscillation operation.

(Item 29) The power management apparatus according to item 28, wherein the power down control signal generation circuit includes a output voltage detection circuit configured to detect the output voltage from the boost converter; and a comparator configured to compare an output of the power supply voltage detection circuit with a reference voltage to generate the power down control signal.

(Item 30) The power management apparatus according to item 25, wherein the auxiliary step-up unit further includes a level shift circuit configured to shift a voltage level of the power down control signal.

(Item 31) The power management apparatus according to item 30, wherein the auxiliary step-up unit further includes a plurality of leakage current reduction transistors configured to cut off the connection of a positive voltage and a negative voltage generated from the output voltage of the oscillator to the level shift circuit when the first switching element is turned OFF, each transistor of the leakage current reduction transistors having a backgate connected to a source of the each transistor so as to form a parasitic diode in a direction in which no leakage current flows when the each transistor is turned OFF.

(Item 32) The power management apparatus according to item 30, wherein the level shift circuit further includes protection transistors configured to reduce a differential voltage across the gate and source nodes to protect the transistors.

(Item 33) The power management apparatus according to item 25, wherein a source and a backgate of the first switching element are commonly connected to the control terminal of the second transistor so as to form a parasitic diode in a direction in which no leakage current flows when the first switching element is turned OFF.

(Item 34) A semiconductor device including a single semiconductor chip on which the power management apparatus is formed, wherein the power management apparatus comprising:
a boost converter configured to generate a power supply voltage applied to a load circuit from an ultra-low voltage generated by an ultra-low voltage generation unit;
an auxiliary step-up unit including an oscillator and a rectifier circuit configured to rectify the output voltage of the oscillator; and
a boost converter control circuit configured to receive the voltage from the auxiliary step-up unit to control the boost converter, wherein the oscillator comprises:
  a transformer including a primary winding configured to receive an input voltage and a secondary winding configured to boost the input voltage to generate an output voltage;
  a first capacitor configured to form an LC resonant circuit together with the secondary winding to cause oscillation;

a first transistor connected in series with the primary winding, the output voltage being applied to a control terminal of the first transistor;
a depletion or native second transistor connected in series with the primary winding and the first transistor;
a current control circuit configured to adjust a control voltage applied to a control terminal of the second transistor to control a current flowing through the first winding; and
a power down circuit configured to control oscillation operation according to whether or not the control voltage from the current control circuit is applied to the control terminal of the second transistor.

What is claimed is:

1. An oscillator comprising:
a transformer including a primary winding configured to receive an input voltage and a secondary winding configured to boost the input voltage to generate an output voltage;
a first capacitor configured to form an LC resonant circuit together with the secondary winding to cause oscillation;
a first transistor connected in series with the primary winding, the output voltage being applied to a control terminal of the first transistor;
a depletion or native second transistor connected in series with the primary winding and the first transistor; and
a current control circuit configured to adjust a control voltage applied to a control terminal of the second transistor to control a current flowing through the first winding.

2. The oscillator as claimed in claim 1, wherein the first transistor is a depletion or native transistor.

3. The oscillator as claimed in claim 1, wherein the first capacitor is connected to a first node to which a first terminal of the secondary winding is connected and a second node to which a second terminal of the secondary winding is connected, and the output voltage is output from the first node.

4. The oscillator as claimed in claim 1, wherein the second transistor is larger in size than the first transistor.

5. The oscillator as claimed in claim 1, wherein the transformer is arranged between the first transistor and the second transistor.

6. The oscillator as claimed in claim 1, wherein the first transistor and the second transistor are directly connected to each other.

7. The oscillator as claimed in claim 1, wherein the primary winding and the secondary winding are wound so as to have a same polarity.

8. The oscillator as claimed in claim 1, wherein the primary winding and the secondary winding are wound so as to have different polarities.

9. The oscillator as claimed in claim 1, wherein the input voltage is an ultra-low voltage generated by an ultra-low voltage generation unit.

10. The oscillator as claimed in claim 1, further comprising a power down circuit configured to control oscillation operation according to whether or not the control voltage from the current control circuit is applied to the control terminal of the second transistor.

11. A power management apparatus comprising:
a boost converter configured to generate a power supply voltage applied to a load circuit from an ultra-low voltage generated by an ultra-low voltage generation unit;
an auxiliary step-up unit including an oscillator and a rectifier circuit configured to rectify an output voltage of the oscillator; and
a boost converter control circuit configured to receive the voltage from the auxiliary step-up unit to control the boost converter, wherein the oscillator comprises:
a transformer including a primary winding configured to receive an input voltage and a secondary winding configured to boost the input voltage to generate an output voltage;
a first capacitor configured to form an LC resonant circuit together with the secondary winding to cause oscillation operation;
a first transistor connected in series with the primary winding, the output voltage being applied to a control terminal of the first transistor;
a depletion or native second transistor connected in series with the primary winding and the first transistor;
a current control circuit configured to adjust a control voltage applied to a control terminal of the second transistor to control a current flowing through the first winding; and
a power down circuit configured to control oscillation operation according to whether or not the control voltage from the current control circuit is applied to the control terminal of the second transistor.

12. The power management apparatus as claimed in claim 11, wherein the power down control signal is input from outside the oscillator.

13. The power management apparatus as claimed in claim 12, wherein until the output voltage from the boost converter reaches a predetermined voltage level, the power down control signal is set to be a first level at which the first switching element is turned ON and the second switching element is turned OFF so that the oscillator performs oscillation operation, and when the output voltage from the boost converter reaches the predetermined voltage level or after the passage of a time during which the power supply voltage from the boost converter is expected to reach the predetermined voltage level, the power down control signal is set to be a second level different from the first level at which the first switching element is turned OFF and the second switching element is turned ON so that the oscillator stops the oscillation operation.

14. The power management apparatus as claimed in claim 11, further comprising a power down control signal generation circuit configured to generate the power down control signal, wherein until the output voltage from the boost converter reaches a predetermined voltage level, the power down control signal generation circuit sets the power down control signal to a first level at which the first switching element is turned ON and the second switching element is turned OFF so that the oscillator performs oscillation operation, and when the output voltage from the boost converter reaches the predetermined voltage level, the power down control signal generation circuit sets the power down control signal to a second level different from the first level at which the first switching element is turned OFF and the second switching element is turned ON so that the oscillator stops the oscillation operation.

15. The power management apparatus as claimed in claim 14, wherein the power down control signal generation circuit includes a output voltage detection circuit configured to detect the output voltage from the boost converter; and a comparator configured to compare an output of the power supply voltage detection circuit with a reference voltage to generate the power down control signal.

16. The power management apparatus as claimed in claim 11, wherein the auxiliary step-up unit further includes a level shift circuit configured to shift a voltage level of the power down control signal.

17. The power management apparatus as claimed in claim 16, wherein the auxiliary step-up unit further includes a plurality of leakage current reduction transistors configured to cut off the connection of a positive voltage and a negative voltage generated from the output voltage of the oscillator to the level shift circuit when the first switching element is turned OFF, each transistor of the leakage current reduction transistors having a backgate connected to a source of the each transistor so as to form a parasitic diode in a direction in which no leakage current flows when the each transistor is turned OFF.

18. The power management apparatus as claimed in claim 16, wherein the level shift circuit further includes protection transistors configured to reduce a differential voltage across the gate and source nodes to protect the transistors.

19. The power management apparatus as claimed in claim 11, wherein a source and a backgate of the first switching element are commonly connected to the control terminal of the second transistor so as to form a parasitic diode in a direction in which no leakage current flows when the first switching element is turned OFF.

20. A semiconductor device including a single semiconductor chip on which the power management apparatus is formed, wherein the power management apparatus comprising:

a boost converter configured to generate a power supply voltage applied to a load circuit from an ultra-low voltage generated by an ultra-low voltage generation unit;
an auxiliary step-up unit including an oscillator and a rectifier circuit configured to rectify the output voltage of the oscillator; and
a boost converter control circuit configured to receive the voltage from the auxiliary step-up unit to control the boost converter, wherein the oscillator comprises:
  a transformer including a primary winding configured to receive an input voltage and a secondary winding configured to boost the input voltage to generate an output voltage;
  a first capacitor configured to form an LC resonant circuit together with the secondary winding to cause oscillation;
  a first transistor connected in series with the primary winding, the output voltage being applied to a control terminal of the first transistor;
  a depletion or native second transistor connected in series with the primary winding and the first transistor;
  a current control circuit configured to adjust a control voltage applied to a control terminal of the second transistor to control a current flowing through the first winding; and
  a power down circuit configured to control oscillation operation according to whether or not the control voltage from the current control circuit is applied to the control terminal of the second transistor.

* * * * *